US012588352B2

(12) United States Patent
Fusella et al.

(10) Patent No.: US 12,588,352 B2
(45) Date of Patent: Mar. 24, 2026

(54) ENERGY LEVELS AND DEVICE STRUCTURES FOR PLASMONIC OLEDS

(71) Applicant: Universal Display Corporation, Ewing, NJ (US)

(72) Inventors: Michael Fusella, Lawrenceville, NJ (US); Nicholas J. Thompson, New Hope, PA (US)

(73) Assignee: Universal Display Corporation, Ewing, NJ (US)

( * ) Notice: Subject to any disclaimer, the term of this patent is extended or adjusted under 35 U.S.C. 154(b) by 1130 days.

(21) Appl. No.: 17/451,032

(22) Filed: Oct. 15, 2021

(65) Prior Publication Data

US 2022/0181571 A1 Jun. 9, 2022

Related U.S. Application Data

(60) Provisional application No. 63/093,987, filed on Oct. 20, 2020.

(51) Int. Cl.
*H10K 50/11* (2023.01)
*H10K 50/18* (2023.01)
(Continued)

(52) U.S. Cl.
CPC ............. *H10K 50/11* (2023.02); *H10K 50/18* (2023.02); *H10K 50/85* (2023.02); *H10K 85/342* (2023.02);
(Continued)

(58) Field of Classification Search
CPC ........ H10K 50/11; H10K 50/18; H10K 50/85; H10K 50/15; H10K 50/16; H10K 85/342;
(Continued)

(56) References Cited

U.S. PATENT DOCUMENTS 4,769,292 A 9/1988 Tang
5,247,190 A 9/1993 Friend
(Continued)

FOREIGN PATENT DOCUMENTS

CN 107305926 A 10/2017
CN 111092164 5/2020
(Continued)

OTHER PUBLICATIONS

Jaewon Lee, Neetu Chopra, Sang-Hyun Eom, Ying Zheng, Jiangeng Xue, Franky So, Jianmin Shi; Effects of triplet energies and transporting properties of carrier transporting materials on blue phosphorescent organic light emitting devices. Appl. Phys. Lett. Sep. 22, 2008; 93 (12): 123306. (Year: 2008).*
(Continued)

*Primary Examiner* — Brigitte A Paterson
(74) *Attorney, Agent, or Firm* — Butzel Long

(57) ABSTRACT

Organic emissive devices are provided that include host structures with electron and/or hole transporting components having specific energy levels that promote good charge balance and enhanced charge capture. The disclosed energy level structures provide host systems that reduce exciplex formation and thereby promote improved device internal quantum efficiency and stability, or which intentionally include exciplex formation so as to modify the average orientation of the dipole.

16 Claims, 17 Drawing Sheets

(51) Int. Cl.

| | |
|---|---|
| ***H10K 50/85*** | (2023.01) |
| ***H10K 85/30*** | (2023.01) |
| ***H10K 85/60*** | (2023.01) |
| ***H10K 101/00*** | (2023.01) |
| ***H10K 101/30*** | (2023.01) |
| ***H10K 101/40*** | (2023.01) |

(52) U.S. Cl.
CPC ......... *H10K 85/626* (2023.02); *H10K 85/631* (2023.02); *H10K 85/654* (2023.02); *H10K 85/6572* (2023.02); *H10K 85/6576* (2023.02); *H10K 2101/30* (2023.02); *H10K 2101/40* (2023.02); *H10K 2101/90* (2023.02)

(58) Field of Classification Search
CPC .. H10K 85/626; H10K 85/631; H10K 85/654; H10K 85/6572; H10K 85/6576; H10K 2101/10; H10K 2101/40; H10K 2101/90
See application file for complete search history.

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 9,960,386 | B2 | 5/2018 | Thompson |
| 10,403,854 | B2 | 9/2019 | Thompson |
| 10,600,980 | B1 | 3/2020 | Boardman |
| 10,663,631 | B2 | 5/2020 | Mikkelsen |
| 11,139,442 | B2 | 10/2021 | Fusella |
| 2003/0230980 | A1 | 12/2003 | Forrest |
| 2004/0174116 | A1 | 9/2004 | Lu |
| 2011/0156059 | A1 | 6/2011 | Reineke |
| 2015/0069352 | A1 | 3/2015 | Kim |
| 2017/0133631 | A1 * | 5/2017 | Thompson ........... H10K 50/828 |
| 2017/0213876 | A1 | 7/2017 | Ohsawa |
| 2017/0229663 | A1 | 8/2017 | Tsai |
| 2017/0309687 | A1 | 10/2017 | Watabe |
| 2019/0036055 | A1 | 1/2019 | Lin |
| 2020/0251670 | A1 | 8/2020 | Thompson |
| 2020/0295288 | A1 | 9/2020 | Fusella |
| 2021/0249633 | A1 | 8/2021 | Fusella |
| 2021/0265584 | A1 | 8/2021 | Fusella |

FOREIGN PATENT DOCUMENTS

| | | | | |
|---|---|---|---|---|
| CN | 111261798 | A | | 6/2020 |
| CN | 111697157 | A | | 9/2020 |
| JP | 2017199903 | A | | 11/2017 |
| JP | 2020149974 | A | | 9/2020 |
| KR | 20110053568 | A | * | 5/2011 |
| KR | 1020130115027 | | | 10/2013 |
| KR | 1020200066575 | | | 6/2020 |
| WO | 2008057394 | A1 | | 5/2008 |
| WO | 2010011390 | A2 | | 1/2010 |

OTHER PUBLICATIONS

NPD, OXD-7, Cbp, Alq3, Ir(ppy)3, TPD material properties.*

Baldo et al. "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Korean Office action (including English translation) issued in App. No. KR1020210140259, dated Dec. 27, 2024, 13 pages.

Japanese Office Action (including English translation) issued in App. No. JP2021170301, dated Apr. 30, 2025, 5 pages.

Chinese Office Action (including English translation) issued in App. No. CN202111223425, dated Oct. 11, 2025, 16 pages.

* cited by examiner

Compound 1

Compound 2

Compound 3

Compound 4

Compound 5

Compound 6

Compound 7

Compound 8

Compound 9

Compound 10

Compound 11

ENERGY LEVELS AND DEVICE STRUCTURES FOR PLASMONIC OLEDS

CROSS-REFERENCE TO RELATED APPLICATIONS

This application claims the priority benefit of U.S. Patent Application Ser. No. 63/093,987, filed Oct. 20, 2020, the entire contents of which are incorporated herein by reference.

FIELD

The present invention relates to organic emissive devices, such as organic light emitting diodes having a plasmonic enhancement layer and associated structure, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

An organic emissive device is provided which includes a substrate; a first electrode disposed over the substrate; an emissive stack disposed over the first electrode and comprising: a first organic emissive layer (EML) comprising one or more host materials and an organic emissive material; and a hole blocking layer (HBL), an electron blocking layer (EBL), or both; a second electrode disposed over the emissive stack; and a first enhancement layer comprising a plasmonic material exhibit surface plasmon resonance that non-radiatively couples to an organic emissive material in the organic emissive layer and transfers excited state energy from the organic emissive material to a non-radiative mode of surface plasmon polaritons of the enhancement layer.

The emissive stack may have various energy level relationships and other features. The emissive stack may include an EBL that has a highest occupied molecular orbit (HOMO) energy level within 0.4 eV of a HOMO energy level of the organic emissive material and/or an EBL having a triplet energy not greater than a triplet energy of at least one of the one or more host materials.

The emissive stack may include an HBL having a lowest unoccupied molecular orbital (LUMO) energy level within 0.3 eV of at least one of the one or more host materials.

At least one of the host materials may form an exciplex with the organic emissive material.

The emissive stack may include an HTL having a HOMO energy level within not more than 0.5 eV of at least one of the one or more host materials.

The emissive stack may meet the condition that $E_{ET} \leq |HOMO_{emitter} - LUMO_{EML}| + \delta$, where $E_{ET}$ is the lowest triplet energy level among all materials in the EML, $LUMO_{EML}$ is the deepest LUMO of all materials in the EML, and $\delta$ is at least 0.01 eV.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
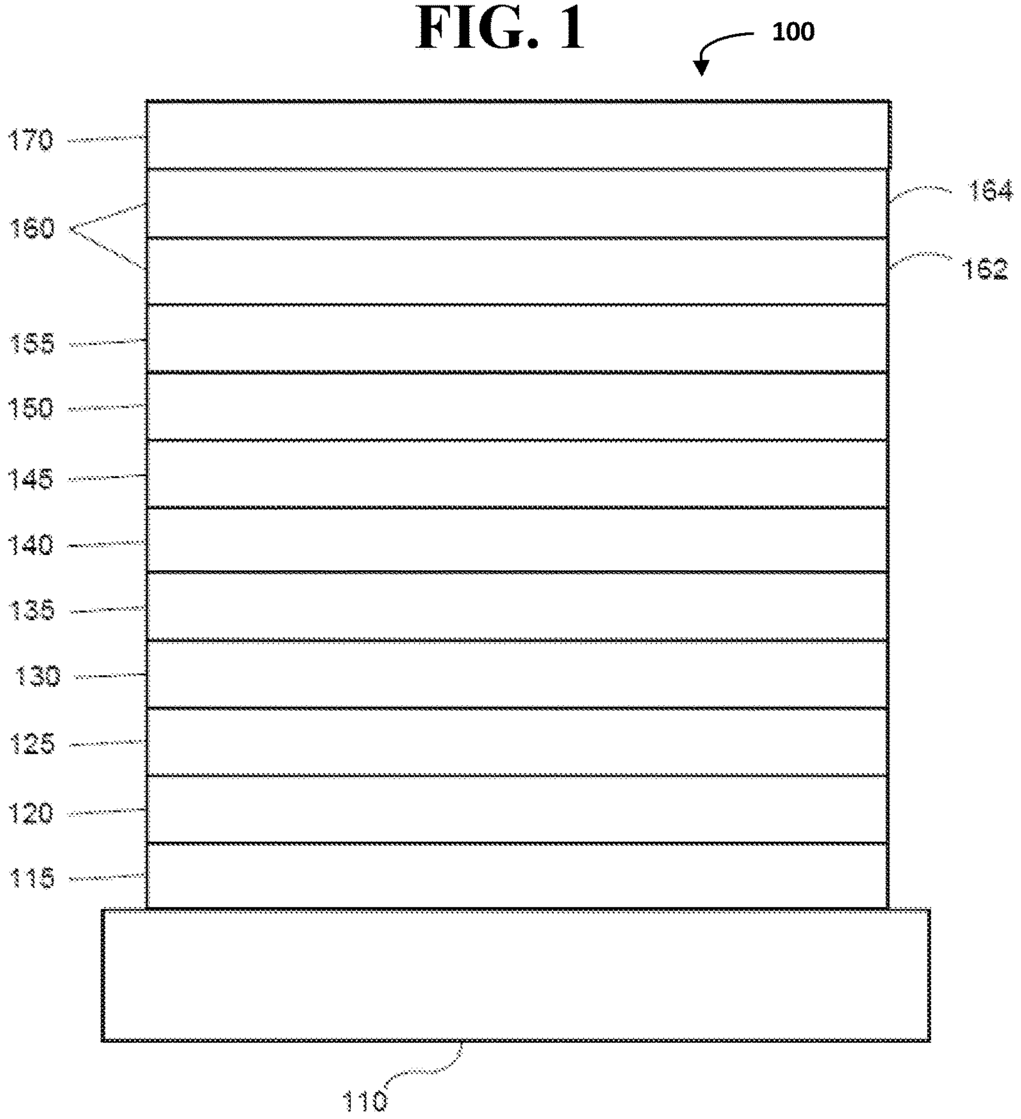
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
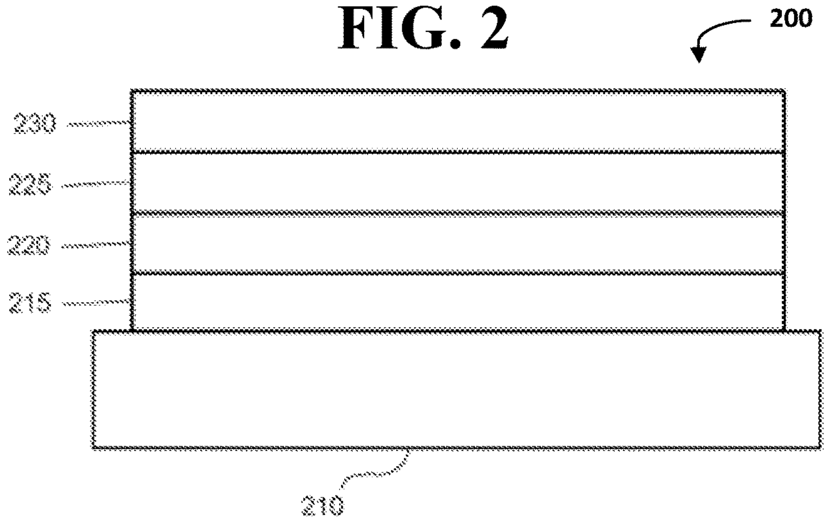
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both.

The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3:
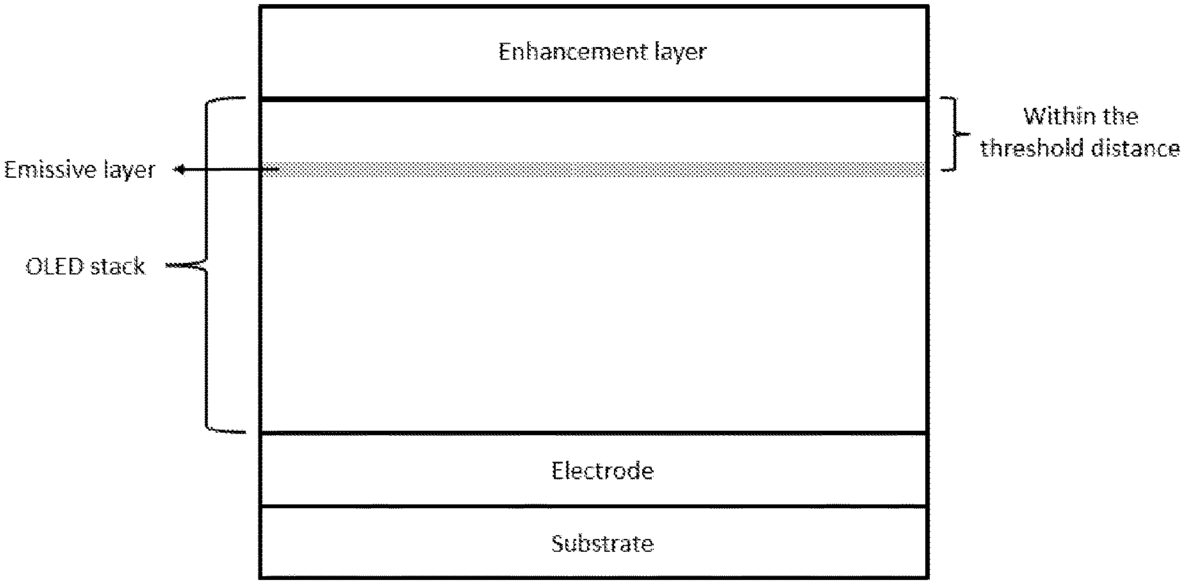
FIG. 3 shows an example device architecture suitable for use with embodiments disclosed herein, in which an emissive layer is located within a threshold distance of an enhancement layer.

It has been found that designing OLEDs to couple most or all the excited state energy into the surface plasmon mode can lead to more stable devices. This may be accomplished by placing the emissive layer (EML) within a threshold distance of the enhancement layer, for example as shown in FIG. 3. The "threshold distance" is defined as the distance at which the total non-radiative decay rate constant is equal to the total radiative decay rate constant as described in further detail in U.S. Pat. No. 9,960,386, which is incorporated by reference in its entirety.

Typically, this approach also may involve thinning the emissive layer (EML), thereby confining the excitons to a small volume and making interactions with excited states more likely. Therefore, charge balance and charge capture may be of particular importance in these types of devices.

Embodiments disclosed herein provide a variety of host structures with electron and/or hole transporting components having specific energy levels that promote good charge balance and enhanced charge capture. In some embodiments, the host systems may reduce exciplex formation, which promotes improved device internal quantum efficiency and stability. Other embodiments may intentionally include exciplex formation to modify the average orientation of the dipole.

Figure 4:
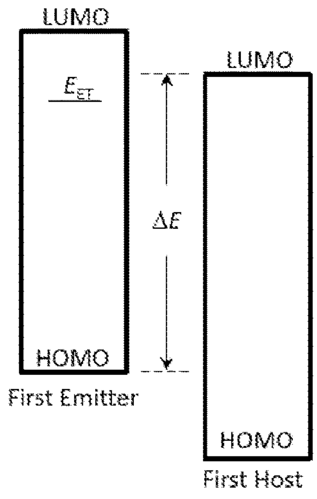
FIG. 4 shows an example of an energy level diagram for a host and emitter system according to embodiments disclosed herein, in which the lowest energy triplet level, $E_{ET}$, is less than the charge transfer state energy, $\Delta E$. Such an arrangement is representative of any multi-component host and emitter system in which any material with the highest HOMO in the system, and any other material with the lowest LUMO in the system satisfy the condition $\Delta E > E_{ET}$, where $E_{ET}$ is the triplet energy of the emitter. Energy level differences are not drawn to scale to emphasize the differences.

In these embodiments, it may be preferred to require that the emitter and its host components do not form an exciplex or charge transfer (CT) state as the lowest energy state in the device. Requiring that the energy of the CT state (if formed) be higher than that of the triplet of the emitter ensures that the device's emission spectrum will be that of the emitter and not the CT state, and that there will be minimal loss in emitter quantum yield in the host system due to exciplex formation. The CT state energy ($\Delta E$) can be taken as the energy difference between the HOMO level of the material having the highest HOMO energy in the organic emissive layer and the LUMO level of the material having the lowest LUMO energy in the organic emissive layer, as shown in FIG. 4. The triplet energy of the emitter is measured using the peak wavelength from the photoluminescence at 77 K. As used herein, $E_{ET}$ is defined as the lowest triplet state (Ti) energy among all materials in the emissive layer.

Figure 5A:
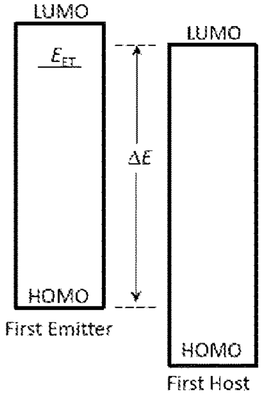
FIGS. 5A, 5B, and 5C show examples of energy level diagrams of single-component host and emitter systems according to embodiments disclosed herein FIGS. 6A-11F inclusive show examples of energy level diagrams of two-component host and emitter systems according to embodiments disclosed herein.
Figure 5B:
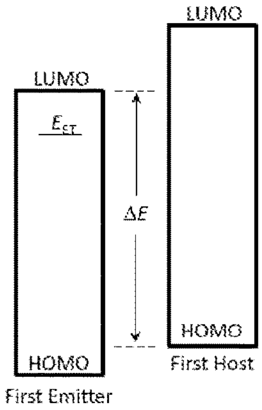
Figure 5C:
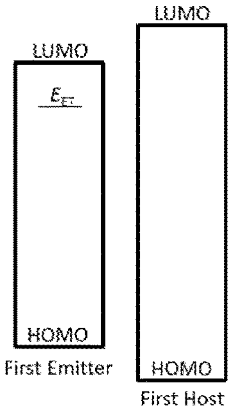
Figure 6A:
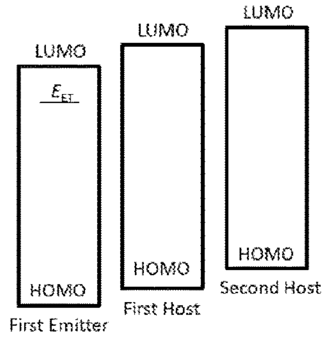
Figure 6B:
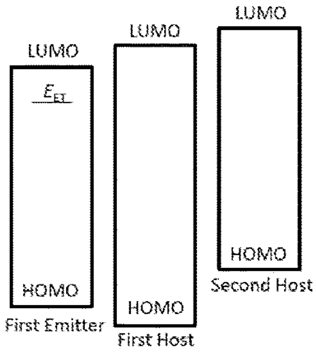
Figure 6C:
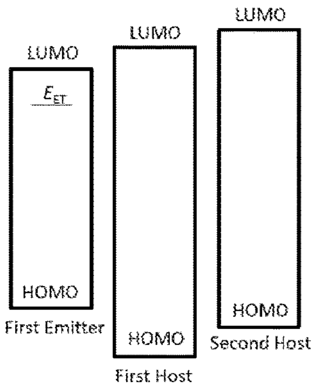
Figure 6D:
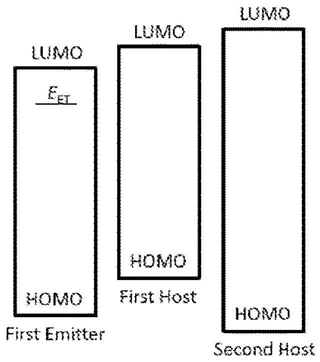
Figure 6E:
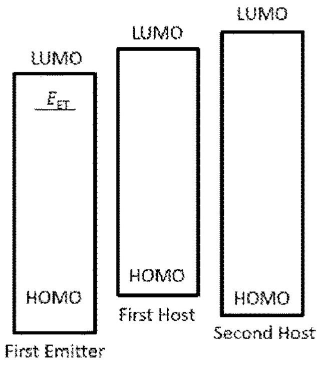
Figure 6F:
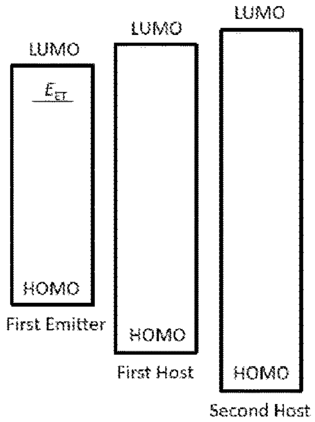
Figure 7A:
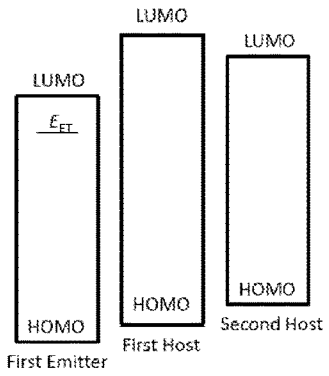
Figure 7B:
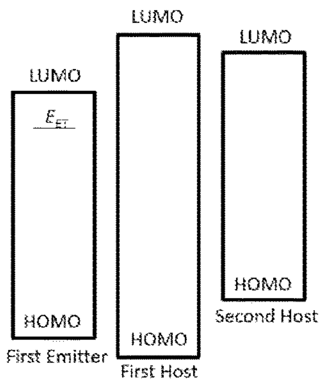
Figure 7C:
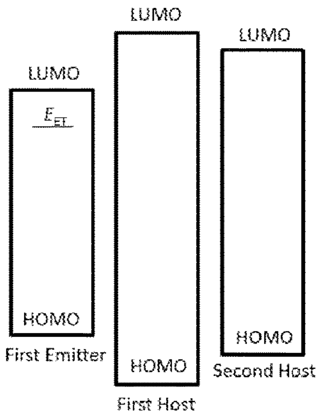
Figure 7D:
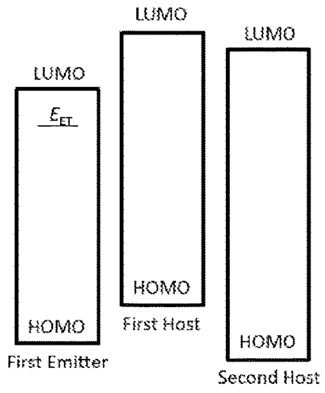
Figure 7E:
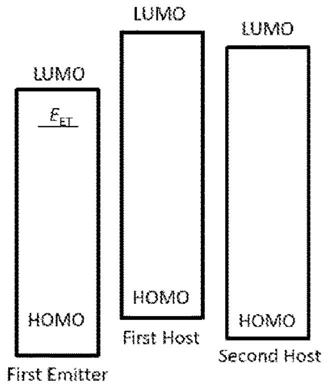
Figure 7F:
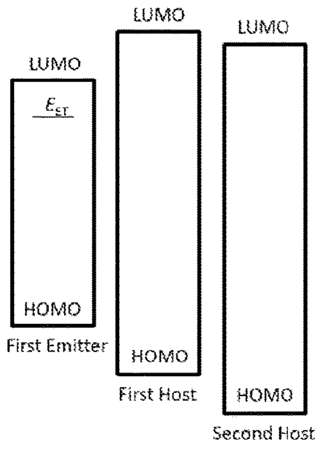
Figure 8A:
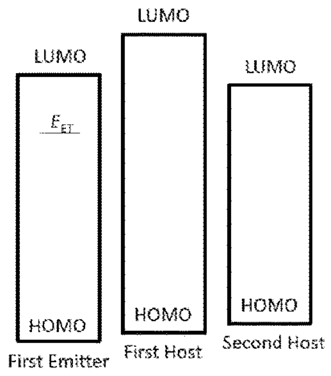
Figure 8B:
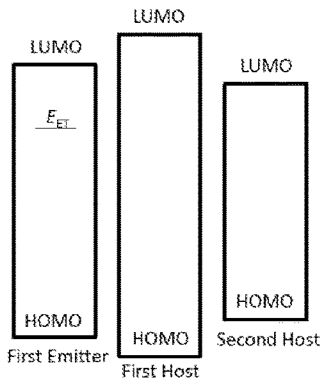
Figure 8C:
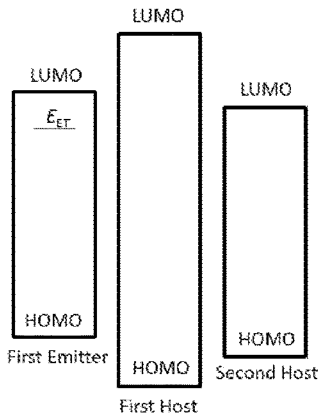
Figure 8D:
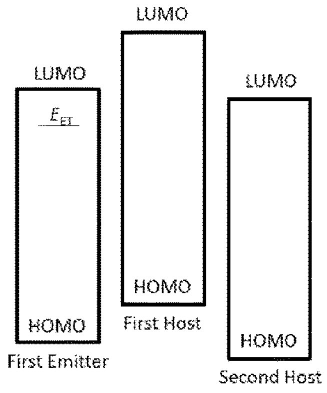
Figure 8E:
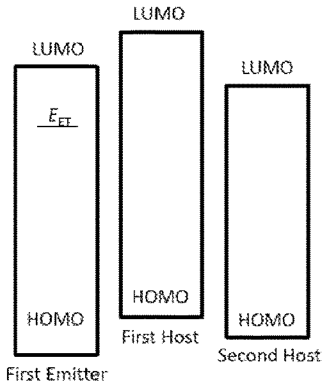
Figure 8F:
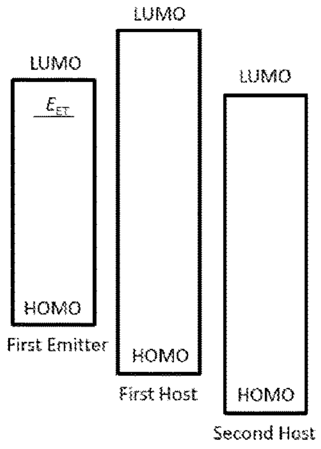
Figure 9A:
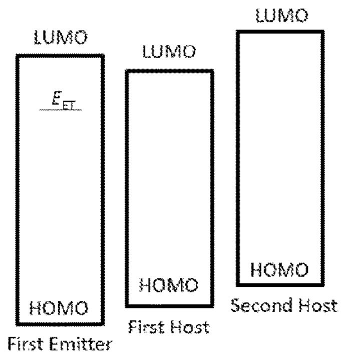
Figure 9B:
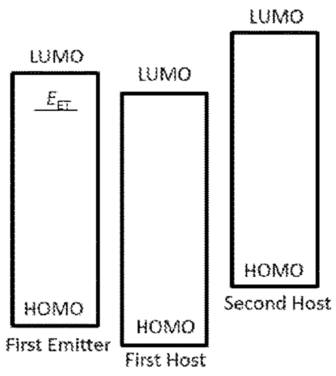
Figure 9C:
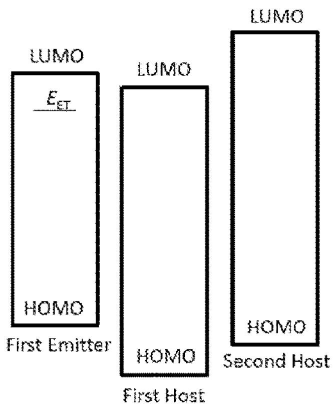
Figure 9D:
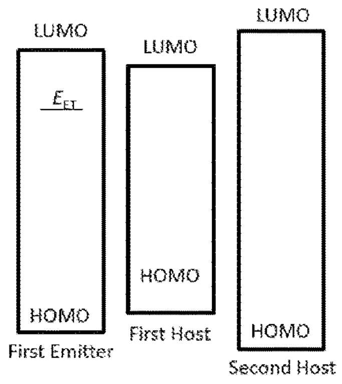
Figure 9E:
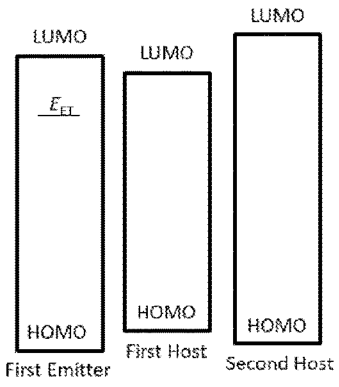
Figure 9F:
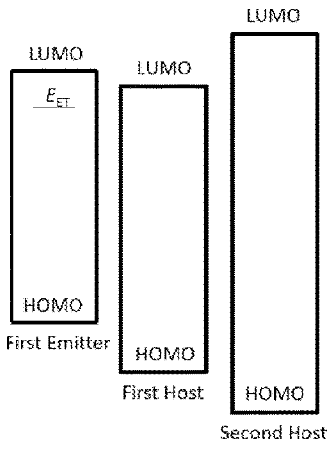
Figure 10A:
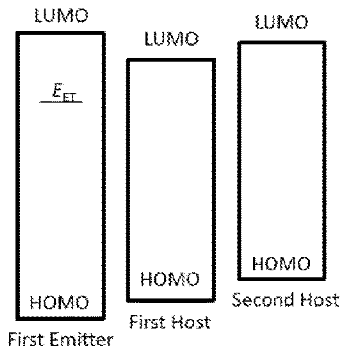
Figure 10B:
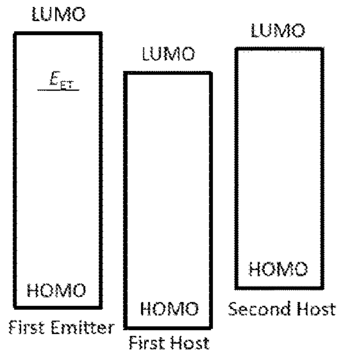
Figure 10C:
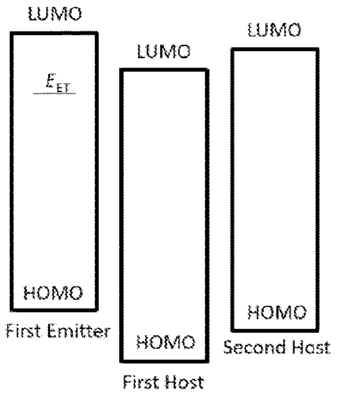
Figure 10D:
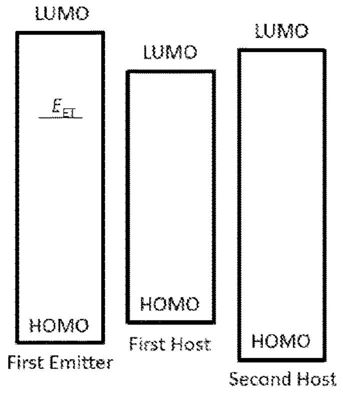
Figure 10E:
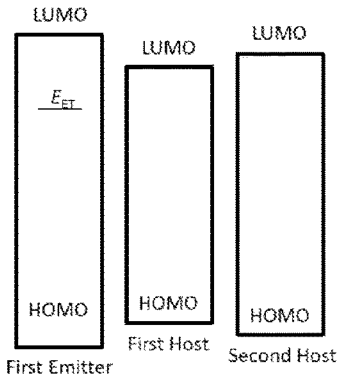
Figure 10F:
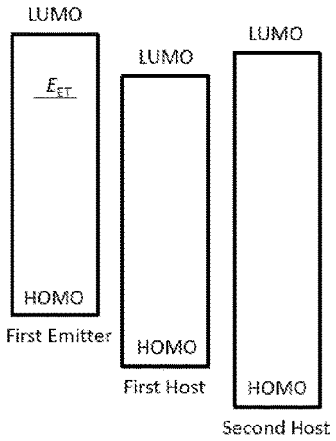
Figure 11A:
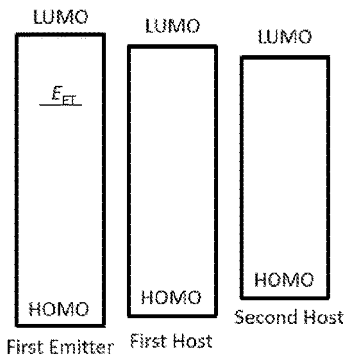
Figure 11B:
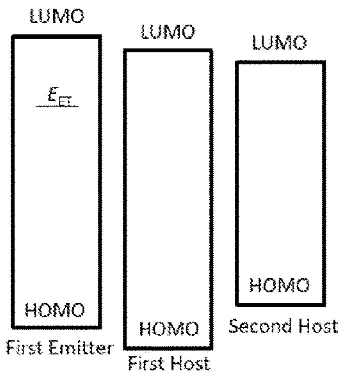
Figure 11C:
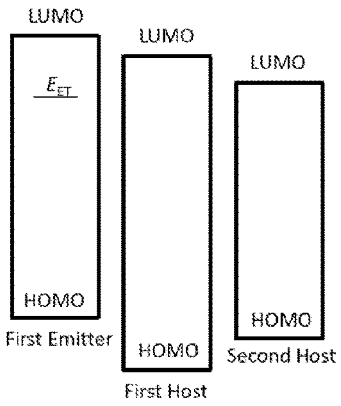
Figure 11D:
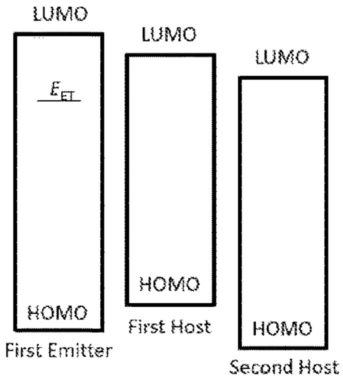
Figure 11E:
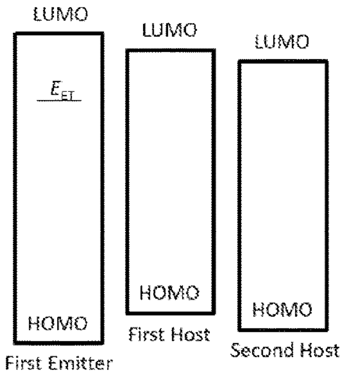
Figure 11F:
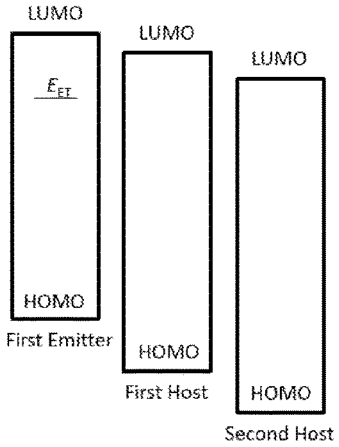
Figure 12A:
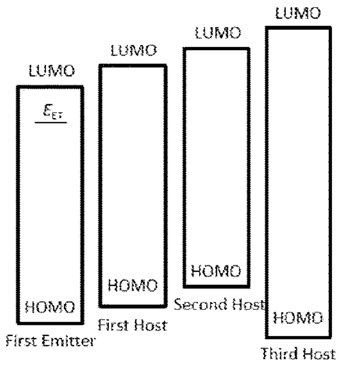
FIGS. 12A-17F inclusive show examples of energy level diagrams of three-component host and emitter systems according to embodiments disclosed herein.
Figure 12B:
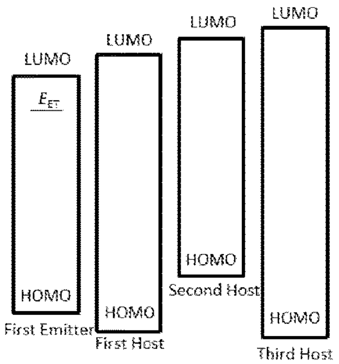
Figure 12C:
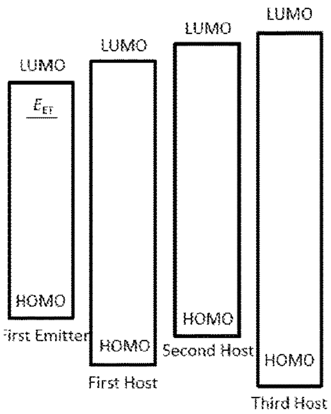
Figure 12D:
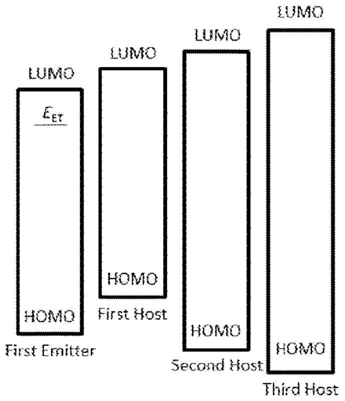
Figure 12E:
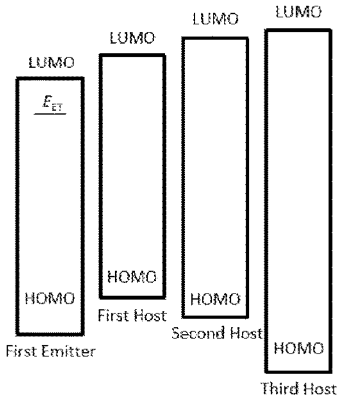
Figure 12F:
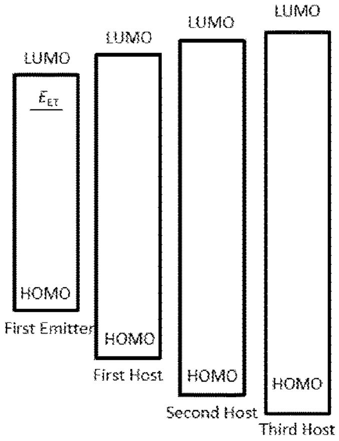
Figure 13A:
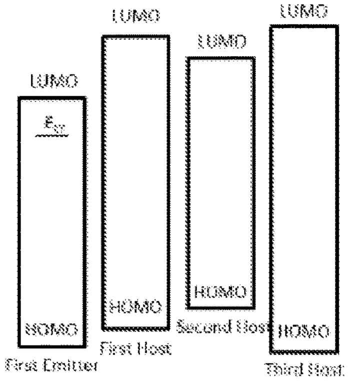
Figure 13B:
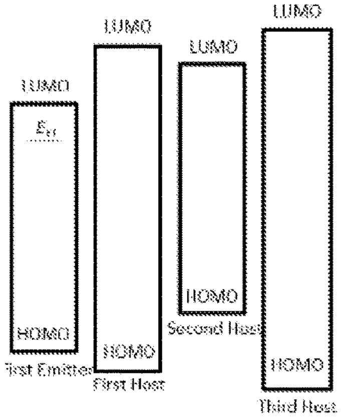
Figure 13C:
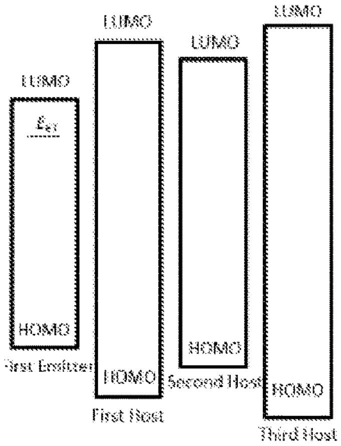
Figure 13D:
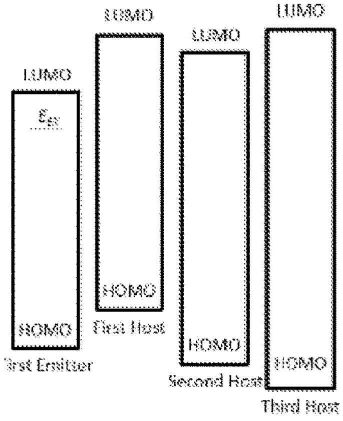
Figure 13E:
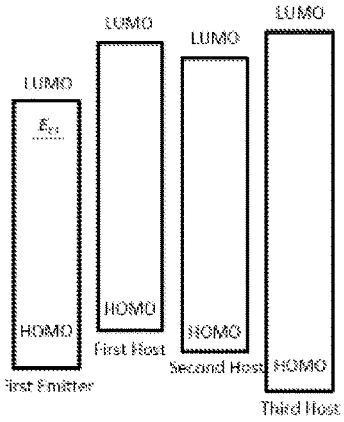
Figure 13F:
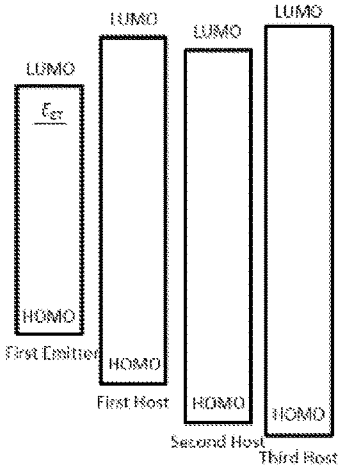
Figure 14A:
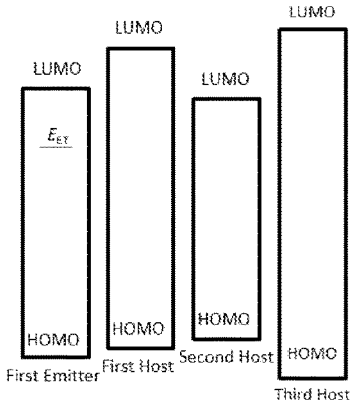
Figure 14B:
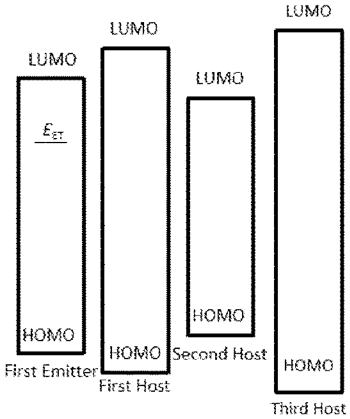
Figure 14C:
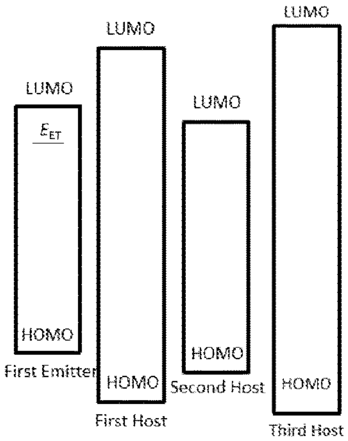
Figure 14D:
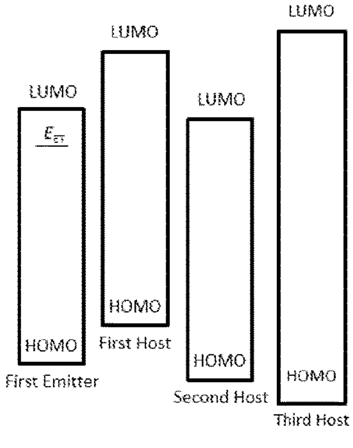
Figure 14E:
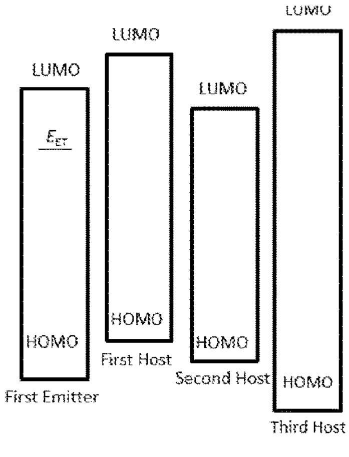
Figure 14F:
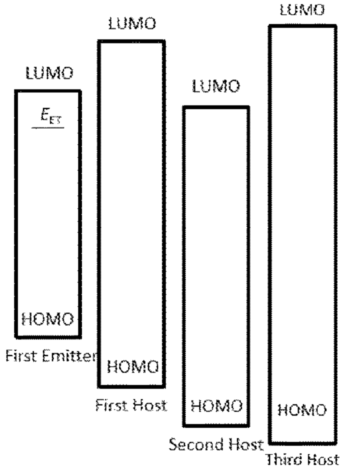
Figure 15A:
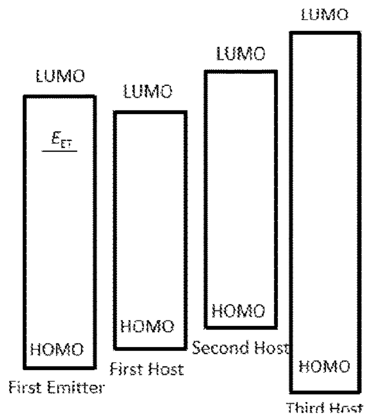
Figure 15B:
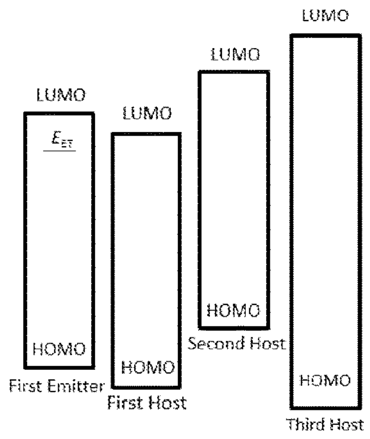
Figure 15C:
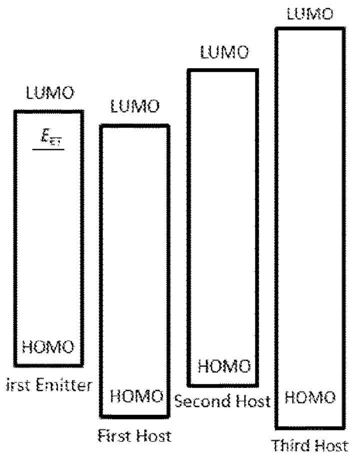
Figure 15D:
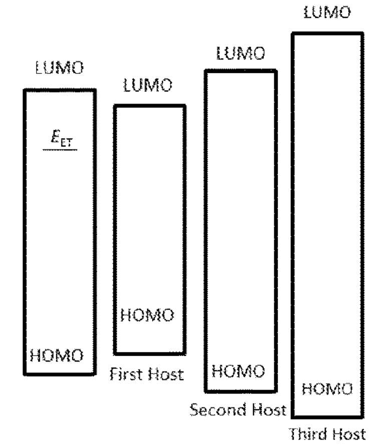
Figure 15E:
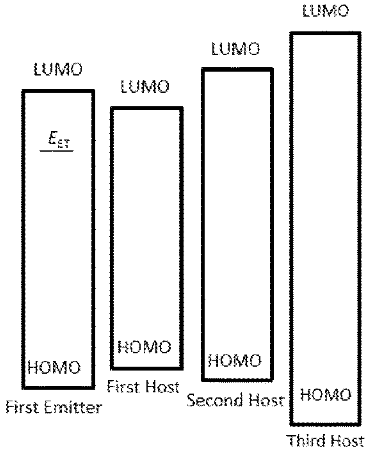
Figure 15F:
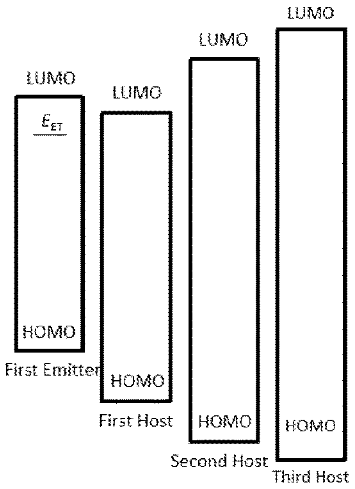
Figure 16A:
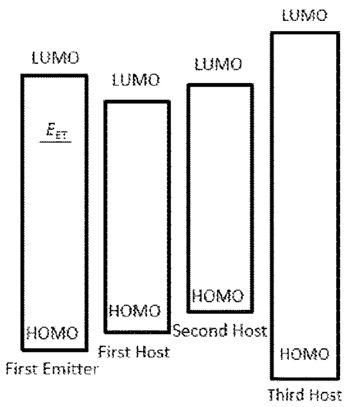
Figure 16B:
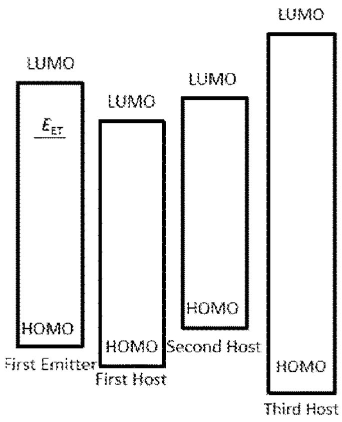
Figure 16C:
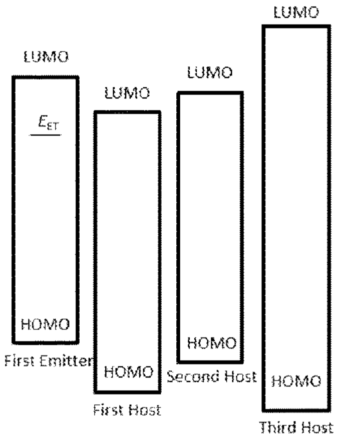
Figure 16D:
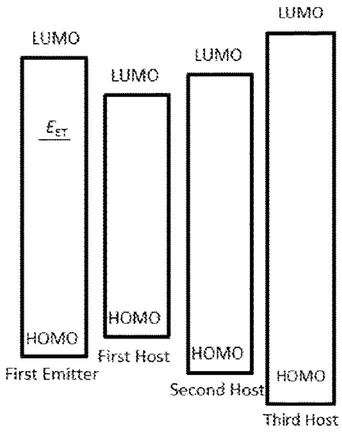
Figure 16E:
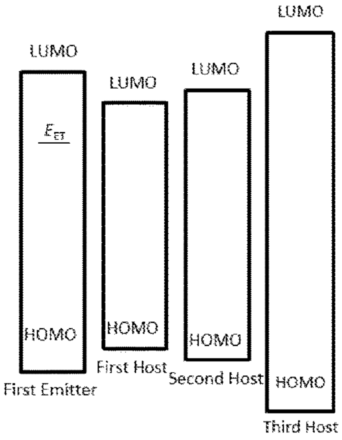
Figure 16F:
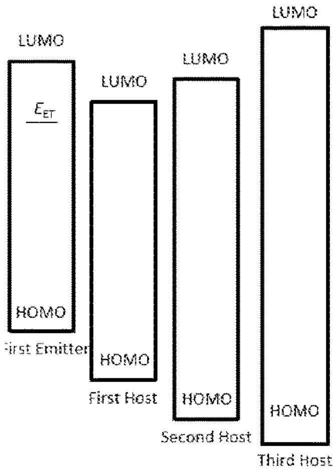
Figure 17A:
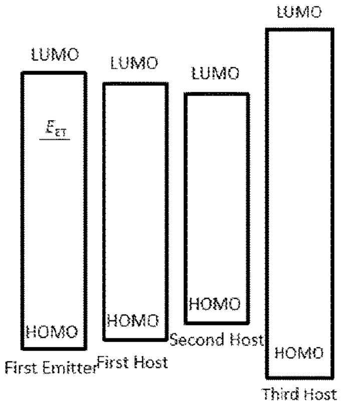
Figure 17B:
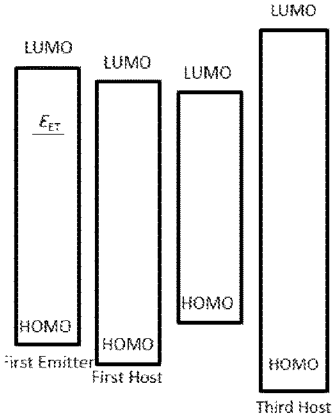
Figure 17C:
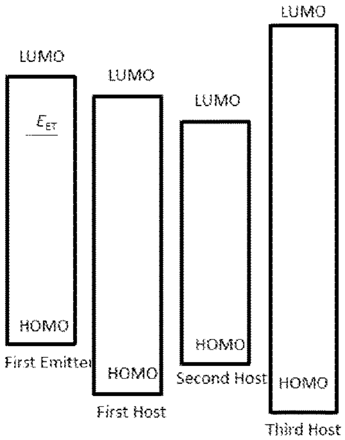
Figure 17D:
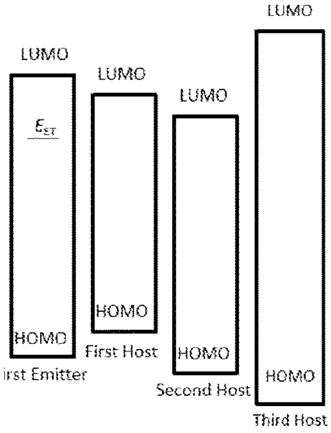
Figure 17E:
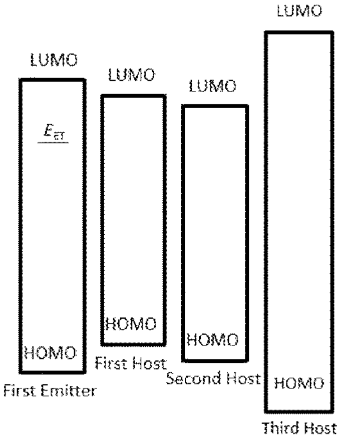
Figure 17F:
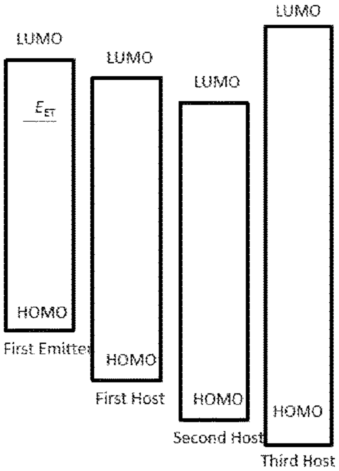

The energy levels of the host components also may be selected to facilitate good charge balance in plasmonic phosphorescent OLED devices. For single component hosts (i.e., first emitter+first host as shown in FIGS. 5A-5C), the host's HOMO level may be tuned to control hole mobility of hole transporting materials. Correspondingly for electron transporting materials, the host's LUMO level may be tuned to control electron mobility. For example, in cases where the host plays a predominant role in the conduction pathway, deepening the HOMO level of the host will slow down hole transport in the device whereas making the host's LUMO level shallower will slow electron transport. In more general terms, as the energy level of the host deviates farther from the energy level of the emitter, the host is less likely to play a significant role in the conduction of charge.

Even if a device has unity charge recombination, having asymmetric hole and electron transport mobilities may negatively affect device stability by pinning holes or electrons at an interface or generate exciton recombination profiles which are preferentially located at one interface of the EML. For example, in a device with relatively high electron mobility but relatively low hole mobility, electrons will build up at the hole transport side of the EML adjacent the electron blocking layer, thus increasing the likelihood of excited state interactions such as triplet-triplet annihilation and triplet-polaron annihilation, which are believed to reduce device stability. Making the host's LUMO level shallower in this example will slow down electrons and spread out the distribution of excited states over a large volume throughout the EML, thereby improving device stability.

If the HOMO level of the emitter is isoenergetic with the HOMO level of the host, then the hole mobility of the system can be enhanced; correspondingly, if the LUMO level of the emitter is isoenergetic with the LUMO level of the host, then electron mobility of the system can be enhanced. This effect may be minimal if the mobility of the dopant is higher than the mobility of holes on the host. As the HOMO level energy of the host becomes deeper than the HOMO of the dopant, the dopant will start to become a strong hole trap, which may impede hole transport if the mobility of the hole on the dopant is less than the mobility of the hole on the host, particularly if the host would play a role in hole transport were the host and dopant HOMO levels isoenergetic. Thus, in some embodiments it may be preferred for the HOMO energy difference between the host and the emitter to be more than 150 meV, or greater than 250 meV, or greater than 350 meV. Similarly, as the LUMO level energy of the host becomes shallower than the LUMO of the dopant, the dopant will start to become a strong electron trap, which may impede electron transport if the mobility of the electron on the dopant is less than the mobility of the electron on the host, particularly if the host would play a role in electron transport were the host and dopant LUMO levels isoenergetic. Thus, in some embodiments it may be preferred for the LUMO energy difference between the host and the emitter to be more than 150 meV, or greater than 250 meV, or greater than 350 meV.

Introducing a second host such as in the examples shown in FIGS. 6-11, may further tune the mobilities of the electrons and holes. For example, deepening the HOMO level of one of the host components below the emitter will introduce a barrier to hole transport and slow down holes, and/or may also present a hole injection barrier into the EML. Thus, in some embodiments it may be preferred for the HOMO energy difference between host and emitter to be more than 150 meV, or greater than 250 meV, or greater than 350 meV. Conversely, making the LUMO of one of the host materials shallower than the emitter will have the effect of slowing down electron transport and/or introducing an electron injection barrier. Thus, in some embodiments it may be preferred for the LUMO energy difference between host and emitter to be more than 150 meV, or greater than 250 meV, or greater than 350 meV. These energy level offsets can be used to finely tune the EML transport properties and hence charge balance in the device.

Introducing a third host, such as shown in the examples in FIGS. 12-17 and 18, may further tune transport properties. An additional hole transporting host can be included to modulate the hole transport properties, while an additional electron transporting host can be included to modulate the electron transport properties. An inert, wide bandgap third host component may play a particularly important role in reducing or eliminating triplet quenching to the host materials, thereby increasing device internal quantum efficiency since host triplets are non-emissive. In some embodiments where the third host is wide bandgap, it can act to dilute the concentration of the other two hosts while preserving the concentration of emitter, thus allowing for further tuning of charge transport. FIGS. 12-17 and 18 show examples of such energy levels, though more generally additional configurations are possible. The HOMO of the third host may be energetically in between the HOMOs of the first and second hosts, in between the HOMOs of the first emitter and first host, deeper than all other HOMOs in the EML, or shallower than all other HOMOs in the EML. Similarly, the LUMO of the third host may be energetically in between the LUMOs of the first and second hosts, in between the LUMOs of the first emitter and first host, deeper than all other LUMOs in the EML while still being shallower than $E_{ET}$, or shallower than all other LUMOs in the EML. In all cases, the LUMO–HOMO energy difference of the third host should be greater than the energy difference between $E_{ET}$ and the HOMO of the first emitter in order to avoid quenching of the excited state energy to the host.

Regardless of the number of hosts used, one or more hosts may be ambipolar and/or mixed with either an electron-transporting host material (e-host) and/or a hole-transporting host material (h-host). In the multi-component host case, one or more ambipolar hosts may be diluted with a wide bandgap host material to allow for further tuning of charge transport. As used herein, an e-host material typically will be the host component with the deepest (lowest) LUMO level, and an h-host material typically will be the host component with the shallowest (highest) HOMO level. Notably, e-host and/or h-host material may include the emitter where it has the deepest LUMO or shallowest HOMO in the emissive layer.

Figure 18:
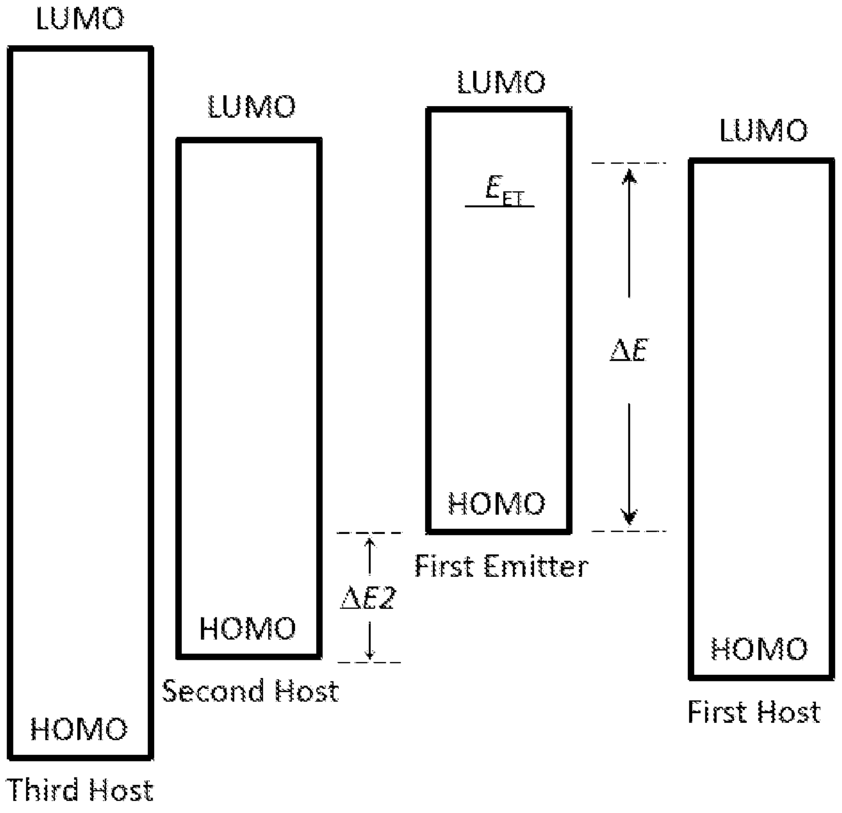
FIG. 18 shows an energy level diagram of a three-component host and emitter system according to embodiments disclosed herein.

FIG. 18 shows an example of a preferred embodiment of a 3-component host structure particularly suitable for blue use with phosphorescent devices in which $E_{ET}$ is less than $\Delta E$ as previously defined. In such an arrangement, 1 high triplet h-type host is used and 1 h-type host for better hole mobility (which often has lower triplet energy) is used. In this way, the overall device has better efficiency than if only the high mobility, lower triplet energy, host is utilized.

In some embodiments, some or all materials in the organic emissive layer may be in a mixture. The mixture may be a homogeneous mixture, or the components of the organic emissive layer may be in graded concentrations through the thickness of the emissive layer. The concentration grading may be linear, non-linear, sinusoidal, or any other suitable form. The emitter may be a phosphorescent metal complex, a delayed fluorescent emitter, or any other suitable type of emissive material and/or structure.

Some embodiments may include injection and/or transport layers to either facilitate or retard charge injection into the EML. In general, hole injection and/or transport materials have a HOMO level similar to that of the shallowest HOMO component of the EML. However, in some embodiments the hole injection and/or transport layer may have a HOMO level that is isoenergetic or even slightly shallower than the highest HOMO component of the EML and still facilitate good hole injection/transport. If the HOMO level of the hole injection and/or transport layer is significantly shallower than the shallowest HOMO component of the EML then hole injection/transport may be retarded.

In other embodiments, the hole transporting material may be aligned for good hole injection into the EML, but a blocking layer can be included to further retard hole injection. In some embodiments, the blocking layer may have a HOMO level deeper than that of the shallowest HOMO level material in the EML. In some embodiments, the blocking layer may enhance hole injection into the EML by having a HOMO level that is intermediate between the HOMO of the hole transporting layer and that of the highest HOMO level material in the EML. In other embodiments, the hole mobility of the hole transporting material may be very reduced even with a HOMO level that is aligned for good hole injection into the EML. Such an arrangement may be used, for example, to modify the charge recombination within the EML. In other embodiments, the mobility of the HTL may be lowered or increased to modify the charge recombination within the EML.

Similarly, in general, electron injection and/or transport materials have a LUMO level shallower than the shallowest LUMO component of the EML. However, in some embodiments, the electron injection and/or transport layer may have a LUMO level that is isoenergetic or even deeper than the shallowest LUMO component of the EML and still facilitate good electron injection and/or transport. If the LUMO level of the electron injection and/or transport layer is significantly deeper than the shallowest LUMO component of the EML, then electron injection/transport may be retarded. In another embodiment, injection and/or transport layers may be doped with another material in order to further facilitate or retard charge injection and/or transport. In another embodiment, a blocking layer can be inserted between the EML and the ETL to facilitate or retard electron injection into the EML. In another embodiment, the mobility of the ETL layer can be lowered or increased to modify the charge recombination within the EML.

Figure 19:
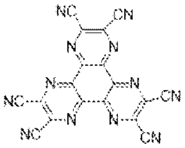
FIG. 19 shows chemical structures of various compounds used with embodiments disclosed herein.
Figure 19:
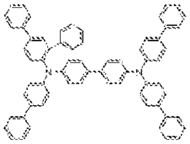
Figure 19:
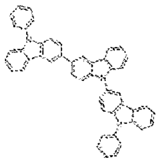
Figure 19:
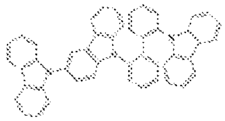
Figure 19:
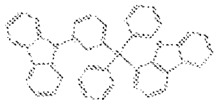
Figure 19:
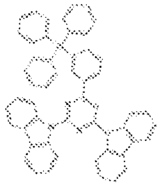
Figure 19:
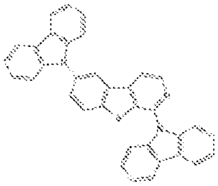
Figure 19:
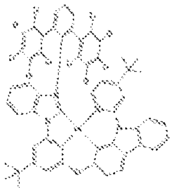
Figure 19:
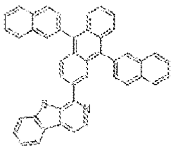
Figure 19:
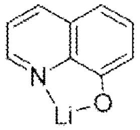
Figure 19:
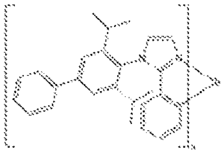

Examples of devices having the structures shown in FIGS. 4-17 were constructed as described below, using the compounds shown in FIG. 19. The specific device structures tested were selected to provide data on a range of available materials and common energy level structures and/or relationships, so as to allow for comparison of the most common and most likely to be used combinations, as well as device and energy level structures that may be significantly different from others. More generally, compounds other than those shown in FIG. 19 may be used without deviating from the results or scope disclosed herein by using materials having the same energy level relationships as described.

As shown by the experimental data disclosed below, it has been found that using emissive and other layers with specific energy level relationships can improve the effects of using an enhancement layer as disclosed herein. For example, the test devices were constructed so that top emission (TE) is dominated by conversion of plasmon energy to light, whereas bottom emission (BE) of the device is dominated by residual emission from energy that was not coupled into the plasmon mode. Thus, the ratio of top to bottom emission TE/BE and similar ratios or calculations can be used to determine the relative portion of emission due to plasmon conversion and thus the effectiveness of an enhancement layer in the device. It has been found using an EBL having a triplet energy level lower than the triplet energy level of the host will increase the ratio of top emission to bottom emission, by reducing the fraction of excitons farther away from the enhancement layer that are more likely to emit out the bottom side of the device (thereby avoiding plasmon in-coupling). Conversely, an EBL having a triplet energy level higher than the host demonstrates a relatively lower TE/BE emission ratio. As another example, when the HOMO energy level of a single host is within 0.2 eV of the emitter with which the host is doped in the emissive layer, the ratio of top emission EQE to bottom emission EQE (TE EQE/BE EQE) decreases. Thus, to maximize TE/BE EQE, EBL triplet levels as low or even slightly lower than the emitter's triplet can be used.

As another example, it has been found that using an emissive material ("emitter") and an emissive layer host (which is doped with the emitter in the EML) which form an exciplex can lead to improved lifetime and device stability. It is believed that this likely is due to the exciplex state being lower in energy that the lowest energy emissive state of the emitter. In general, the lower energy the excited state in an OLED device, the more stable the OLED device is.

As another example, it has been found that when an e-host (electron transporting host) LUMO energy level is isoenergetic with the HBL LUMO level, there is a stability enhancement that is reduced when a barrier is introduced with the e-host. To take advantage of this to improve device stability, the HBL may be selected such that the LUMO level is within about 0.3 eV of the e-host LUMO level.

Other similar energy level relationships among the materials in the OLED have been found that improve device performance, such as efficiency, stability, and/or lifetime. As specific examples, the following relationships have been found to have beneficial effects: the EBL has a HOMO level within 0.4 eV of a HOMO energy level of the organic emissive material (emitter); the EBL has a triplet energy not greater than a triplet energy of at least host material in the EML; the HBL has a LUMO level within 0.3 eV of at least one host material in the EML; at least one EML host material forms an exciplex with the organic emissive material in the EML; the HTL has a HOMO energy level within not more than 0.5 eV of at least one host materials in the EML; and $$E_{ET} \geq |HOMO_{emitter} - LUMO_{EML}| + \delta,$$

where $E_{ET}$ is the lowest triplet energy level among all materials in the EML, $LUMO_{EML}$, is the deepest LUMO of all materials in the EML, and δ is at least 0.01 eV, at least 0.11 eV, or at least 0.21 eV. Generally, these and similar relationships indicated by the present disclosure including the data below may be used with any emissive device structure having the associated layer(s), including any of the appropriate energy level relationships shown in FIGS. 4-18, where allowed by the selected inequality or other relationship.

Experimental

Devices were fabricated as described below to illustrate the various energy level relationships and benefits disclosed herein. In the example devices, various host materials (e-hosts, h-hosts, or combinations thereof), electron- and hole-blocking layers (HBL) were considered. The devices incorporate an EML within a threshold distance of an enhancement layer as defined herein, in conjunction with a nanoparticle outcoupling scheme such as, for example, a nanoparticle layer or monolayer separated from an enhancement layer, to convert energy stored inside the plasmon mode to light. Examples of suitable nanoparticle outcoupling structures are provided in U.S. Patent Publication No. 2021/0265584, the disclosure of which is incorporated by reference in its entirety for all purposes.

In these devices, the top emission (TE) is dominated by conversion of plasmon energy to light, whereas the bottom emission (BE) is dominated by residual emission from energy that was not coupled into the plasmon mode. As suggested by the data provided herein, devices with high TE/BE ratios, for example, TE/BE greater than 1, more preferably greater than 2, even more preferably greater than 3, indicate that plasmon energy extraction is the dominant source of light output from the device and also that plasmon in-coupling is dominant (i.e., majority of excited state energy is going into the plasmon mode). As such, it may be preferred for devices disclosed herein to have relatively high TE/BE ratios. Table 7 shows HOMO and LUMO energy levels for the various compounds used in the examples.

Tables 1~4 summarize how device performance, such as external quantum efficiency (EQE), is influenced by the EBL. For all EBL materials used in the example devices, the LUMO of the EBL is higher than the LUMO of Compound 8 and Compound 6, thus confining the electron to the emissive layer. However, the HOMO levels of the EBL materials differ, with Compound 3 having the shallowest HOMO level and Compound 5 having the deepest HOMO level. The EBL material triplet energies differ as well, with the triplet of Compound 3 being lower in energy than the triplet energies of either Compound 5 or Compound 4. All these factors influence the final efficiency of the device.

For example, when using Compound 3 or Compound 4 as the EBL with Compound 8 as the emitter (Table 1), the top-emission EQE of the device (TE EQE) is significantly higher than for Compound 5. This indicates that for this system, having a HOMO level similar to that of the emitter is beneficial for achieving good EQE. More generally, EBLs having a HOMO energy level within about 0.4 eV of the emitter HOMO energy level achieve a relatively high EQE, as shown in Table 1 when using Compound 8 as an emitter. The host/emitter combinations shown in Table 1 have been found to provide such performance. We also see that the highest EQE is obtained with Compound 4 as the EBL indicating that there may be quenching at the EBL interface that is limiting the EQE of the devices with a Compound 3 EBL. More generally, this data suggest that EBLs with HOMO levels within 0.4 eV of the emitter HOMO level achieve a relatively high EQE when using Compound 8 as the emitter. Compounds 4 and 5 have the same LUMO level, but the Compound 4 EBL outperforms the Compound 5 EBL, suggesting there is no similar trend for LUMO levels. The arrangement of energy levels for the compounds shown in Table 1 correspond to those illustrated in FIG. 8F.

The bottom half of Table 1 shows that the EQE difference between using Compound 4 or Compound 3 as the EBL compared to Compound 5 has been lessened by using Compound 4 as the hole transporting host in the EML. This is due to the fact that the host is now more actively participating in hole transport, and thus there is less exciton quenching at the EBL interface as the recombination zone gets moved farther away from this interface.

TABLE 1

Device performance summary of mixed host plasmon devices with various EBL materials and Compound 8 as the emitter.

| Host | EBL | HBL | TE EQE (%) |
|---|---|---|---|
| Compound 5:Compound 6 | Compound 5 | Compound 6 | 2.7 |
| Compound 5:Compound 6 | Compound 3 | Compound 6 | 3.5 |
| Compound 5:Compound 6 | Compound 4 | Compound 6 | 4.9 |
| Compound 4:Compound 6 | Compound 5 | Compound 6 | 3.0 |
| Compound 4:Compound 6 | Compound 3 | Compound 6 | 3.5 |
| Compound 4:Compound 6 | Compound 4 | Compound 6 | 4.9 |

The host material also may affect which EBL gives the highest TE EQE for a given device. For example, again considering a Compound 8 emitter, we find that when the single host Compound 6 is used with an Compound 7 HBL as shown in Table 2, the highest TE EQE occurs for a Compound 4 EBL, but when a Compound 4 host is used with an Compound 7 HBL, the highest TE EQE occurs for a Compound 3 EBL. This occurs because the e-host Compound 6 relies on the emitter to transport holes resulting in slower hole transport and a recombination zone that is close to the EBL interface. When an Compound 3 EBL is used, hole transport is sped up compared to an Compound 4 EBL, moving the recombination zone further from the EBL interface thereby enabling more plasmon in-coupling and a potentially higher TE EQE; however, these gains are overcome by the quenching that the Compound 3 EBL induces. When the h-host Compound 4 is used, hole transport is sped up and the recombination zone is located near the HBL interface. This enables enhanced plasmon in-coupling due to the proximity of the recombination zone to the cathode, thereby increasing TE EQE.

The enhanced plasmon in-coupling can be measured by looking at the ratio of top-emission EQE to bottom-emission, i.e., TE EQE/BE EQE, which is high for a large amount of plasmon in-coupling and low for a small amount of plasmon in-coupling. Since plasmon coupling is a near-field coupling process, the closer the exciton to the enhancement layer, the more likely it is to in-couple to the plasmon mode. In other words, excitons located at the EML/HBL interface are more likely to in-couple to the plasmon mode than excitons located at the EBL/EML interface. Similarly, a shorter distance from the EML to the enhancement layer will increase the TE EQE/BE EQE ratio. Additionally, emitter molecules or emissive layers with higher amounts of vertically aligned transition dipole moments (TDMs) will have higher TE EQE/BE EQE ratios as coupling to the plasmon mode is enhanced while residual emission out of the device cavity is suppressed. Surface roughness of the enhancement layer, particularly at the organic interface, can also affect the ratio, with the general trend that more surface roughness leads to better plasmon in-coupling and hence a higher TE EQE/BE EQE ratio.

Interestingly, the EBL (Compound 3) that provided the highest EQE also has the highest TE EQE/BE EQE ratio as the excitons are primarily located near the HBL interface due to faster hole transport. Moreover, the exciton quenching that Compound 3 introduces at the EBL interface reduces the fraction of excitons farther away from the enhancement layer that are more likely to emit out the bottom side of the device (i.e., avoid plasmon in-coupling).

TABLE 2

Device performance summary of single host plasmon devices with various EBL materials and Compound 8 as the emitter.

| Host | EBL | HBL | TE EQE (%) | TE EQE/ BE EQE |
|---|---|---|---|---|
| Compound 6 | Compound 4 | Compound 7 | 4.6 | 0.74 |
| Compound 6 | Compound 5 | Compound 7 | 2.0 | 0.71 |
| Compound 6 | Compound 3 | Compound 7 | 3.3 | 0.83 |
| Compound 4 | Compound 4 | Compound 7 | 3.3 | 0.70 |
| Compound 4 | Compound 5 | Compound 7 | 0.8 | 0.53 |
| Compound 4 | Compound 3 | Compound 7 | 3.6 | 0.78 |

The energy level structure for the Compound 6 host devices with Compound 8 emitter corresponds to the structure shown in FIG. 5A, and the Compound 4 host devices with Compound 8 emitter corresponds to the structure in FIG. 5C. These results indicate that for a single host system with a Compound 8 type emitter, an EBL with a triplet energy equal to that of the emitter will lead to exciton quenching at the EBL interface, reducing exciton density at that interface which is farther away from the enhancement layer, thereby increasing TE EQE and TE/BE (plasmon in-coupling). So it may be desirable for the riplet energy of the EBL to be higher than that of emitter to maximize the TE EQE. When the HOMO energy of a single-compound host is within 0.2 eV of the emitter, the TE EQE/BE EQE decreases. To maximize the TE EQE/BE EQE ratio in such devices, triplet levels as low as, or slightly lower than the emitter's triplet energy level may be used.

The impact of host combinations with emitter Compound 8 was also studied using the structures shown in Table 3. In terms of device stability, the host combinations Compound 5:Compound 6 and Compound 4:Compound 6 have the longest $LT_{90}$ values whereas the single host EMLs of Compound 4 or Compound 5 have the shortest $LT_{90}$ values. That is, the devices shown in the first two rows, containing e-host Compound 6, are more stable than those in the other rows of Table 3. When the e-host LUMO is isoenergetic with the HBL LUMO, there is a stability enhancement that is no longer present when a barrier is introduced with Compound 7 e-host. These devices have the energy level structures shown in FIG. 8F. More generally, to achieve this effect it may be desirable for the HBL LUMO to be within not more than 0.3 eV of the e-host LUMO for improved device stability.

When using Compound 11 as the emitter, it was found that mixed hosts provide improved device stability over single hosts. It is believed that the increased device stability in the mixed host cases results from improved charge balance, which may increase the volume occupied by the formed excitons thereby reducing the likelihood of destabilizing triplet-triplet and triplet-polaron interactions.

Notably, the Compound 4:Compound 6 host with Compound 11 emitter has an unexpectedly high LT90 lifetime. This likely is due to the formation of an exciplex between compounds 11 and 6, or, with much lower likelihood, between Compounds 11 and 7. Such an effect may be used to improve device stability by selecting such materials that will form an exciplex between the emitter material and at least one component of the host.

TABLE 3

Device stability summary of plasmon devices with various host materials and either Compound 8 or Compound 11 as the emitter.

| Host | Emitter | EBL | HBL | $LT_{90}$ @ 20 mA/cm$^2$ (hrs) |
|---|---|---|---|---|
| Compound 5: Compound 6 | Compound 8 | Compound 3 | Compound 6 | 22 |
| Compound 4: Compound 6 | Compound 8 | Compound 3 | Compound 6 | 21 |
| Compound 4: Compound 7 | Compound 8 | Compound 3 | Compound 6 | 15 |
| Compound 6 | Compound 8 | Compound 3 | Compound 6 | 13 |
| Compound 4 | Compound 8 | Compound 3 | Compound 6 | 12 |
| Compound 5 | Compound 8 | Compound 3 | Compound 6 | 8 |
| Compound 4: Compound 6 | Compound 11 | Compound 3 | Compound 6 | 61 |
| Compound 4: Compound 7 | Compound 11 | Compound 3 | Compound 6 | 28 |
| Compound 5: Compound 7 | Compound 11 | Compound 3 | Compound 6 | 23 |
| Compound 7 | Compound 11 | Compound 3 | Compound 6 | 23 |
| Compound 4 | Compound 11 | Compound 3 | Compound 6 | 15 |
| Compound 5 | Compound 11 | Compound 3 | Compound 6 | 8 |

Device material energy levels may be similarly important when optimizing the device EQE and using a material such as Compound 11 as the emitter. For the mixed-host cases, it was found that the EQE is the same for Compound 3 or Compound 4 as the EBL even though they have different triplet energies, as shown in Table 4. This is because the mixed hosts provide efficient charge transport of both holes and electrons, resulting in a recombination zone spread throughout the EML, thereby making quenching at the blocking layer interfaces less important. The Compound 5:Compound7 host devices have the energy level structure shown in FIGS. 10C and 11C since the cohost HOMO levels are isoenergetic); the Compund 4:Compound 7 devices have the energy level structure shown in FIG. 10C.

When using Compound 5 as the EBL, the inability to efficiently inject holes into the EML overrides the balancing of charges due to using a mixed host system, leading to a lower EQE, as shown by the lower TE EQE in row 2 of Table 4. Notably, the difference between the Compound 5 HOMO energy level and the HTL is 0.5 eV, whereas Compounds 3 and 4 have HOMO energy levels are closer than 0.5 eV to the HTL HOMO level. Accordingly, it may be preferred for the HOMO energy level difference between the HTL and the EBL to be not more than 0.5 eV to improve device performance.

TABLE 4

Device performance summary of mixed host plasmon devices with various EBL materials and Compound 11 as the emitter.

| Host | EBL | HBL | TE EQE (%) |
|---|---|---|---|
| Compound 5:Compound 7 | Compound 4 | Compound 7 | 5.9 |
| Compound 5:Compound 7 | Compound 5 | Compound 7 | 1.4 |
| Compound 5:Compound 7 | Compound 3 | Compound 7 | 5.9 |
| Compound 4:Compound 7 | Compound 4 | Compound 7 | 5.9 |
| Compound 4:Compound 7 | Compound 5 | Compound 7 | 1.5 |
| Compound 4:Compound 7 | Compound 3 | Compound 7 | 6 |

For the single-host case, it was found that Compound 4 and Compound 3 EBLs have a larger influence on TE EQE when a Compound 5 host is used compared to Compound 7 as a host, as shown by the results in Table 5. This is because the Compound 7 host results in an increase in $CIE_{y,BE}$ that better aligns the emission spectrum with the resonance of the nanoparticle outcoupling scheme, thereby resulting in a higher TE EQE/BE EQE ratio. This redshift dominates the TE EQE trend (note that the BE EQE is instead highest for the Compound 5 host), making the impact of the EBL on TE EQE less important. We also note that the total (TE+BE) EQE is highest for the Compound 7 host because the improved spectral overlap leads to more efficient out-coupling of the plasmon energy. The Compound 5:11 and 7:11 host:emitter combinations shown in Table 5 have energy level structures corresponding to FIG. 5A.

TABLE 5

Device performance summary of single host plasmon devices with various EBL materials and Compound 11 as the emitter.

| Host | EBL | HBL | TE EQE (%) | BE EQE (%) | TE EQE/ BE EQE | $CIE_{y,BE}$ |
|---|---|---|---|---|---|---|
| Compound 5 | Compound 4 | Compound 7 | 3.5 | 6.5 | 0.54 | 0.368 |
| Compound 5 | Compound 5 | Compound 7 | 1.1 | 2.8 | 0.39 | 0.278 |
| Compound 5 | Compound 3 | Compound 7 | 4.4 | 6.9 | 0.64 | 0.373 |
| Compound 7 | Compound 4 | Compound 7 | 5.7 | 5.9 | 0.97 | 0.425 |
| Compound 7 | Compound 5 | Compound 7 | 0.9 | 1.4 | 0.64 | 0.238 |
| Compound 7 | Compound 3 | Compound 7 | 6 | 5.7 | 1.05 | 0.434 |

In general, because of the red-shifted NPA resonance with respect to Compound 11 emission, materials combinations that increase CIEy lead to better plasmon outcoupling performance (i.e., higher TE EQE). In the devices shown in Table 5, the Compound 7 host does this, as do Compounds 3 and 4 EBLs, which have HOMOs within 0.3 eV of the host HOMO energy. The decrease in BE EQE coupled with the increase in TE EQE (and hence increase in TE/BE) suggests that the recombination zone is shifted toward the enhancement layer when a Compound 7 host is used in comparison to a Compound 5 host. Devices having Compound 5 or 3 as the EBL exhibit increased TE EQE due to their HOMO level increasing hole injection. More generally, this indicates that having an EBL with a HOMO level within 0.3 eV of the host results in an improved EQE. This same result is obtained with the devices shown in Table 1, which used a Pt-based emitter instead of the Ir-based emitter used in Table 5.

The choice of materials also may affect which HBL material is preferred for a given device structure, as shown by the results in Table 6. With a Compound 11 emitter, when the h-host Compound 4 is mixed with the e-host Compound 7, we find that a Compound 7 HBL yields higher TE EQE than when Compound 6 is used for the HBL. This is because the Compound 7 HBL provides no electron injection barrier into the host unlike the Compound 6 HBL, thereby providing better charge balance in the host and higher recombination efficiency.

Devices were also constructed in which a mixed-host system forms an exciplex with the emitter. The results are shown in Table 6. When the mixed host Compound 4:Compound 6 is used with Compound 11, an exciplex forms between Compound 6 and Compound 11, as evidenced by the increase in $CIE_y$. This exciplex may have a lower quantum yield than the emitter itself leading to a lower TE EQE of these devices. However, the TE EQE/BE EQE is higher for these devices compared to the device without the exciplex. This suggests more energy is being coupled into the plasmon mode in these devices or that more of the energy is being outcoupled. The exciplex formed in the emissive layer may result in an increase in the vertical dipole ratio, leading to more in-coupling of energy into the plasmon mode and hence the higher TE/BE EQE ratio. The re-shift in spectrum also may result in better spectral overlap of the emission spectrum and the spectral response of the Ag nanocube based outcoupling scheme. Increased overlap between the emission spectrum and the outcoupling will increase the fraction of energy in the plasmon mode that can be outcoupled, leading to a higher TE EQE/BE EQE ratio. The devices in Table 6 have the energy level structure shown in FIG. 10C.

TABLE 6

Device performance summary of mixed host plasmon devices with Compound 11 emitter and various HBL materials.

| Host | Emitter | EBL | HBL | TE EQE (%) | $CIE_{y,BE}$ | TE EQE/ BE EQE |
|---|---|---|---|---|---|---|
| Compound 4:Compound 6 | Compound 11 | Compound 4 | Compound 6 | 2.4 | 0.424 | 1.04 |
| Compound 4:Compound 6 | Compound 11 | Compound 4 | Compound 7 | 2.6 | 0.422 | 1.08 |
| Compound 4:Compound 7 | Compound 11 | Compound 4 | Compound 6 | 5.1 | 0.405 | 0.76 |
| Compound 4:Compound 7 | Compound 11 | Compound 4 | Compound 7 | 5.9 | 0.402 | 0.75 |

In the Compound 4:Compound 7 devices, the LUMO of the Compound 7 co-host is within 0.5 eV of the LUMO of the host Compound 4. This provides a large EQE enhancement compared to the devices that use the Compound 6 co-host, which is 0.8 eV away from the LUMO of host Compound 4. However, the formation of a low-PLQY exciplex Compounds 6 and 11 likely dominates performance of these devices. It is believed that an inefficient exciplex forms between Compounds 6 and 11, resulting in a lower EQE, so this type of structure may be used to avoid the low-efficiency exciplex formation. The EQE behavior also may be explained by better alignment of the LUMO levels between Compounds 7 and 4 than with Compounds 6 and 4, and the large LUMO level difference between Compounds 6 and 4 may negatively affect charge balance and/or transport within the EML, thus lowering EQE.

More generally, to avoid potentially low-quantum-yield exciplex formation, it may be preferred for devices to have energy level structures in which $E_{ET}$ is less than the absolute difference between the emitter HOMO and the deepest LUMO of all materials in the EML with an additional delta of at least 0.01 eV, more preferably at least 0.11 eV, more preferably at least 0.21 eV. That is, $$E_{ET} \leq |HOMO_{emitter} - LUMO_{EML}| + \delta$$

Where $E_{ET}$ is as defined previously, $LUMO_{EML}$ is the deepest LUMO of all materials in the emissive layer, and δ is at least 0.01 eV, 0.11 eV, or 0.21 eV.

TABLE 7

Energy levels for the EBL, HBL, host, and emitter materials.

| Material | HOMO (eV) | LUMO (eV) | Triplet, $T_1$ (eV) |
|---|---|---|---|
| Compound 7 | −5.7 | −2.5 | 3.0 |
| Compound 5 | −5.7 | −2.0 | 3.5 |
| Compound 3 | −5.4 | −1.8 | 2.7 |
| Compound 4 | −5.5 | −2.0 | 3.0 |
| Compound 6 | — | −2.8 | 3.0 |
| Compound 8 | −5.3 | −2.1 | 2.7 |
| Compound 11 | −4.9 | −1.9 | 2.7 |

In some embodiments, it may be useful to select and/or construct materials that have specific desired HOMO, LUMO, or other energy level structures, for example to meet the energy level relationships previously disclosed for host materials, blocking materials, or other materials in the emissive stack or the device. For example, chemical moieties may be selected and combined to form specific host materials, blocking layers, or the like.

Table 8 shows examples of organic moieties that may be used to build hosts and blocking layers that are used in some embodiments as previously disclosed. It will be understood by one of skill in the art that the list in Table 8 list is not exhaustive, but is intended to provide example moieties and an associate energy level and typical energy level range for a host or transport layer composed of that moiety.

In some materials multiple fragments may be used. To determine an estimate of the energy level of the final compound, the shallowest HOMO level (i.e., the most positive energy level value) and the deepest LUMO (i.e., most negative energy level value) as the estimated HOMO and LUMO of the final compound, though in some cases the exact value may fall outside this estimate. For example, Compound 7 is composed of two carbazoles connected to an aryl group which would be similar to Fragment #1 and Fragment #14, resulting in an estimated HOMO energy level of −5.7 eV and an estimated LUMO energy level of −2.45 eV, which is consistent with the actual measured HOMO of −5.7 and LUMO of −2.5. Similarly, Compound 5 is composed of Fragments #1, #26, and #13, resulting in an estimated HOMO energy level of −5.7 eV and an estimated LUMO energy level of −2.1 eV. This is consistent with the measured HOMO of −5.7 eV and measured LUMO of −2.0 eV.

TABLE 8

Example moieties and relevant energy levels for host material and transport layer construction

| Number | Moiety | Energy Level | Range (eV) |
|---|---|---|---|
| 1 | 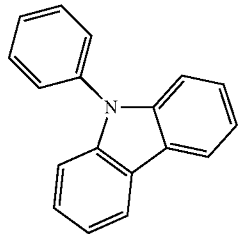 | HOMO | −5.7 ± 0.15 |
| 2 | 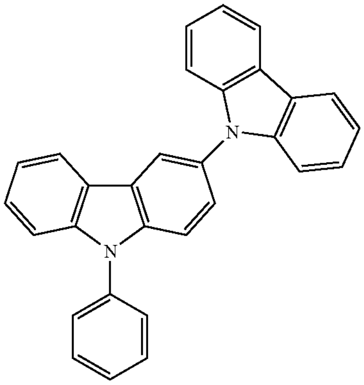 | HOMO | −5.5 ± 0.15 |
| 3 | 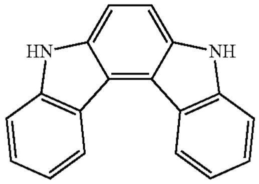 | HOMO | −5.4 ± 0.15 |

TABLE 8-continued
| Example moieties and relevant energy levels for host material and transport layer construction | | | |
| --- | --- | --- | --- |
| Number | Moiety | Energy Level | Range (eV) |
| 4 | 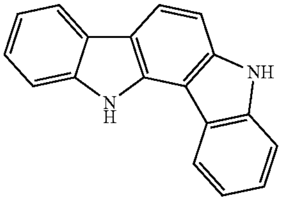 | HOMO | −5.6 ± 0.15 |
| 5 | 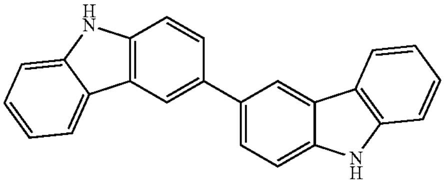 | HOMO | −5.4 ± 0.15 |
| 6 | 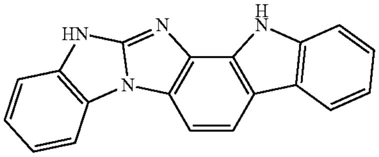 | HOMO | −5.3 ± 0.15 |
| 7 | 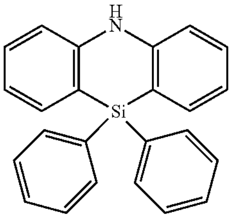 | HOMO | −5.35 ± 0.15 |
| 8 | 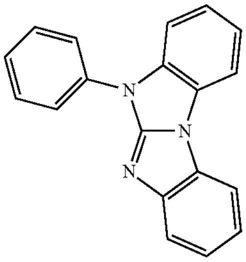 | HOMO | −5.65 ± 0.15 |
| 9 | 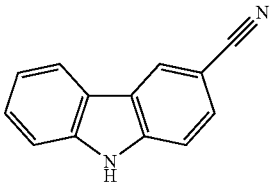 | HOMO | −5.9 ± 0.15 |
| 10 | 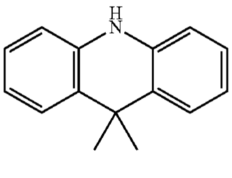 | HOMO | −5.35 ± 0.15 |

TABLE 8-continued
| Example moieties and relevant energy levels for host material and transport layer construction | | | |
|---|---|---|---|
| Number | Moiety | Energy Level | Range (eV) |
| 11 | 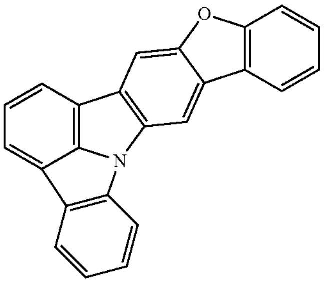 | HOMO | −5.75 ± 0.15 |
| 12 | 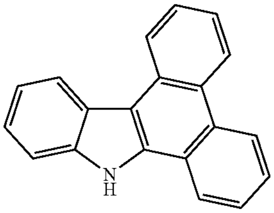 | HOMO | −5.65 ± 0.15 |
| 13 | 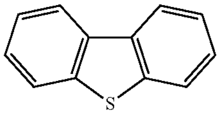 | LUMO | −2.1 ± 0.15 |
| 14 | 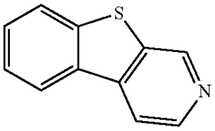 | LUMO | −2.45 ± 0.1 |
| 15 | 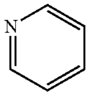 | LUMO | −2.45 ± 0.15 |
| 16 | 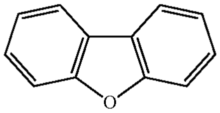 | LUMO | −2.1 ± 0.15 |
| 17 | 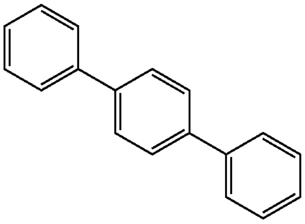 | LUMO | −2.1 ± 0.15 |
| 18 | 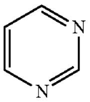 | LUMO | −2.65 ± 0.15 |

TABLE 8-continued
Example moieties and relevant energy levels for host material and transport layer construction
| Number | Moiety | Energy Level | Range (eV) |
|---|---|---|---|
| 19 | 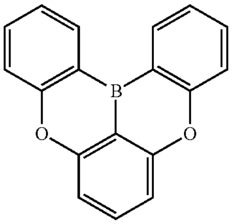 | LUMO | −2.55 ± 0.15 |
| 20 | 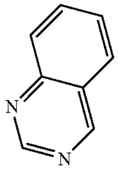 | LUMO | −2.85 ± 0.15 |
| 21 | 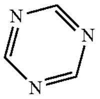 | LUMO | −2.75 ± 0.15 |
| 22 | 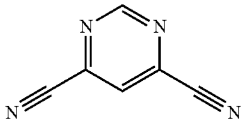 | LUMO | −3.2 ± 0.15 |
| 23 | 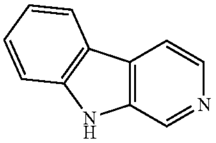 | LUMO | −2.1 ± 0.15 |
| 24 | 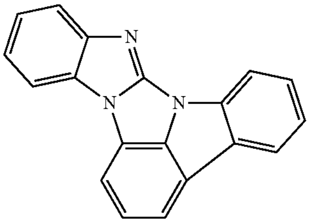 | LUMO | −2.7 ± 0.15 |
| 25 | 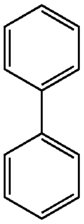 | LUMO | −1.9 ± 0.15 |
| 26 | 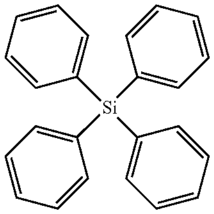 | LUMO | −1.6 ± 0.2 |

The fragments shown in Table 8, in conjunction with one another and/or other organic molecule fragments, may be used to construct phosphorescent, thermally activated delayed fluorescent, and fluorescent emitter molecules.

In some cases, the emitter molecule also may include heavy metals such as Ir, Os, Pt, Pd, Au, Rh, Ru, Cu, or Ag. Some example emitter molecular base structures with estimated ranges for the energy levels are featured in Table 9.

TABLE 9

Example emitter molecular base structures and estimated energy levels.

| Number | Emitter base structure | HOMO range (eV) | LUMO range (eV) |
|---|---|---|---|
| 1 | 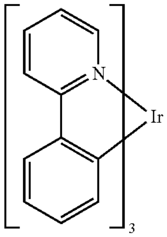 | −5.1 ± 0.3 | −2.1 ± 0.3 |
| 2 | 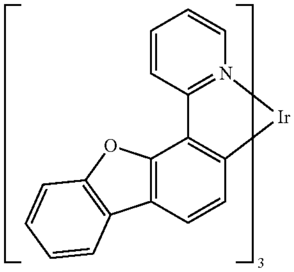 | −5.1 ± 0.3 | −2.1 ± 0.3 |
| 3 | 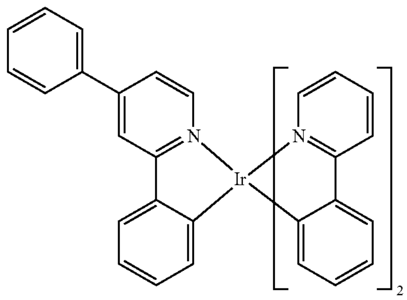 | −5.1 ± 0.3 | −2.4 ± 0.3 |
| 4 | 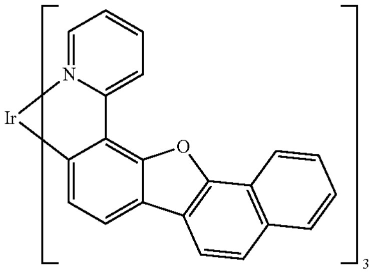 | −5.1 ± 0.3 | −2.1 ± 0.3 |
| 5 | 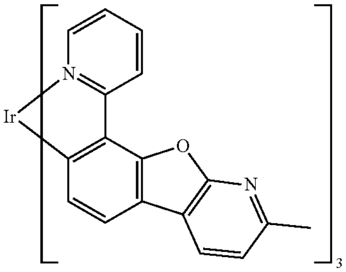 | −5.2 ± 0.3 | −2.2 ± 0.3 |

TABLE 9-continued
| Example emitter molecular base structures and estimated energy levels. | | | |
|---|---|---|---|
| Number | Emitter base structure | HOMO range (eV) | LUMO range (eV) |
| 6 | 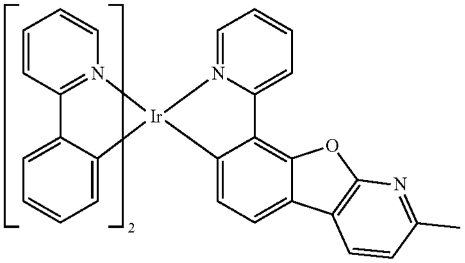 | −5.2 ± 0.3 | −2.2 ± 0.3 |
| 7 | 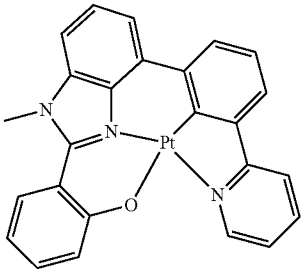 | −5.2 ± 0.3 | −2.6 ± 0.3 |
| 8 | 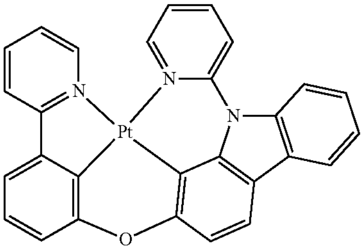 | −5.2 ± 0.3 | −2.4 ± 0.3 |
| 9 | 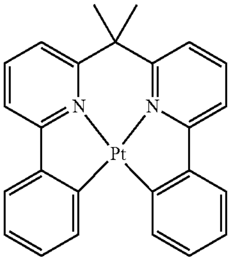 | −5.4 ± 0.3 | −2.5 ± 0.3 |
| 10 | 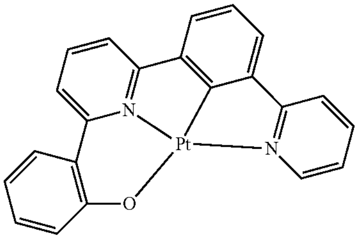 | −5.0 ± 0.3 | −2.5 ± 0.3 |

TABLE 9-continued
Example emitter molecular base structures and estimated energy levels.
| Number | Emitter base structure | HOMO range (eV) | LUMO range (eV) |
|---|---|---|---|
| 11 | 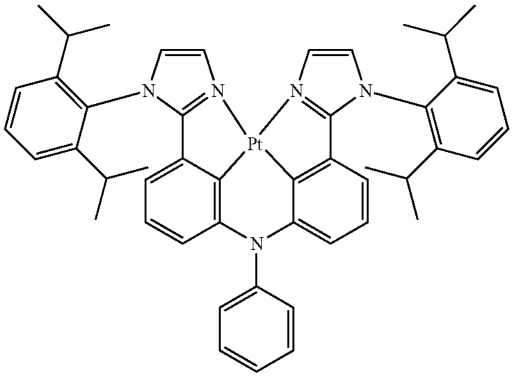 | −4.9 ± 0.3 | −1.9 ± 0.3 |
| 12 | 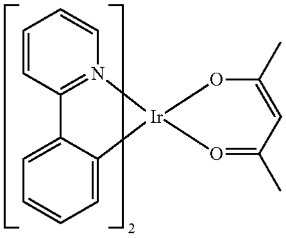 | −5.2 ± 0.3 | −2.2 ± 0.3 |
| 13 | 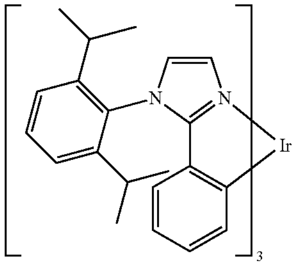 | −4.9 ± 0.3 | −2.0 ± 0.3 |
| 14 | 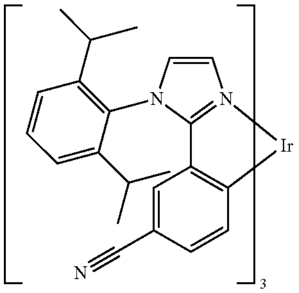 | −5.4 ± 0.3 | −2.0 ± 0.3 |
| 15 | 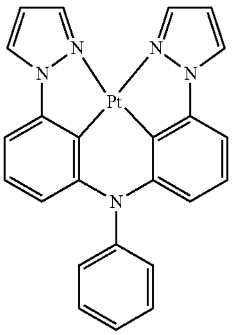 | −5.0 ± 0.3 | −1.9 ± 0.3 |

TABLE 9-continued
| Example emitter molecular base structures and estimated energy levels. | | | |
|---|---|---|---|
| Number | Emitter base structure | HOMO range (eV) | LUMO range (eV) |
| 16 | 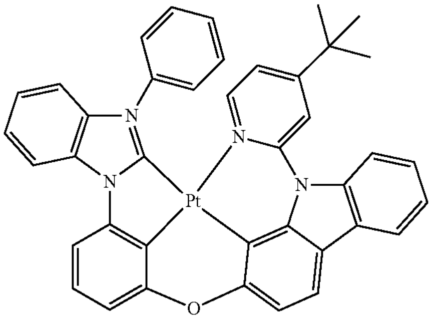 | −5.3 ± 0.3 | −2.2 ± 0.3 |
| 17 | 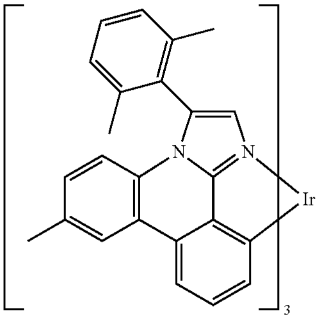 | −5.0 ± 0.3 | −2.1 ± 0.3 |
| 18 | 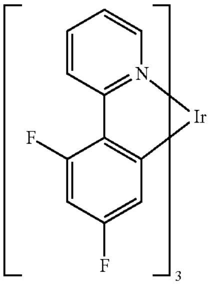 | −5.6 ± 0.3 | −2.3 ± 0.3 |
| 19 | 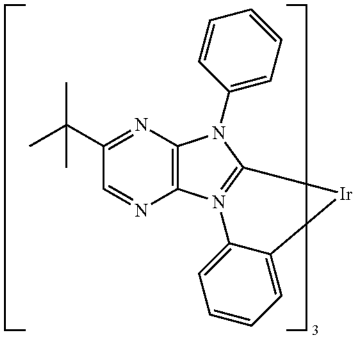 | −5.5 ± 0.3 | −2.4 ± 0.3 |

TABLE 9-continued
| Example emitter molecular base structures and estimated energy levels. | | | |
|---|---|---|---|
| Number | Emitter base structure | HOMO range (eV) | LUMO range (eV) |
| 20 | 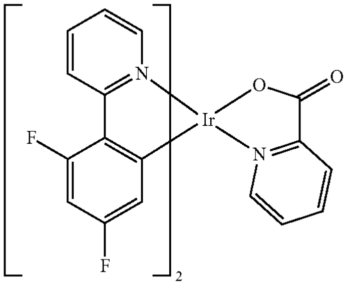 | −5.7 ± 0.3 | −2.5 ± 0.3 |
| 21 | 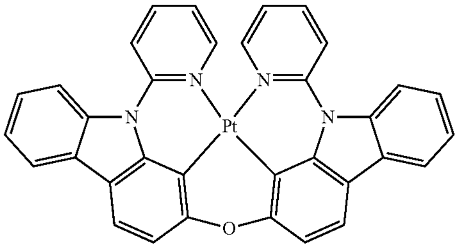 | −5.2 ± 0.3 | −2.3 ± 0.3 |
| 22 | 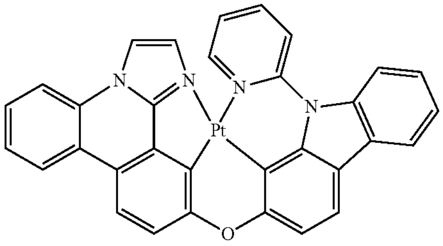 | −5.0 ± 0.3 | −2.3 ± 0.3 |
| 23 | 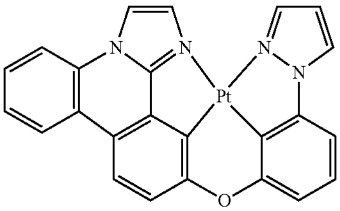 | −5.4 ± 0.3 | −2.1 ± 0.3 |
| 24 | 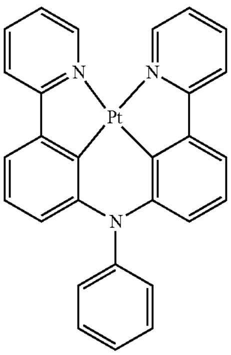 | −4.8 ± 0.3 | −2.5 ± 0.3 |

TABLE 9-continued
Example emitter molecular base structures and estimated energy levels.
| Number | Emitter base structure | HOMO range (eV) | LUMO range (eV) |
|---|---|---|---|
| 25 | 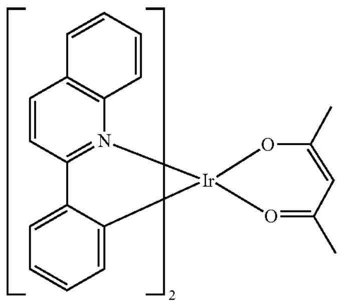 | −5.1 ± 0.3 | −2.5 ± 0.3 |
| 26 | 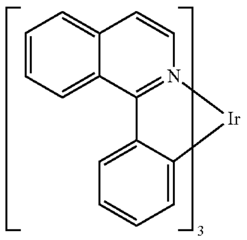 | −5.1 ± 0.3 | −2.5 ± 0.3 |
| 27 | 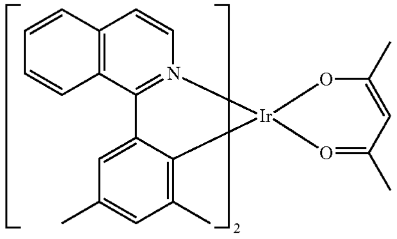 | −5.1 ± 0.3 | −2.5 ± 0.3 |
| 28 | 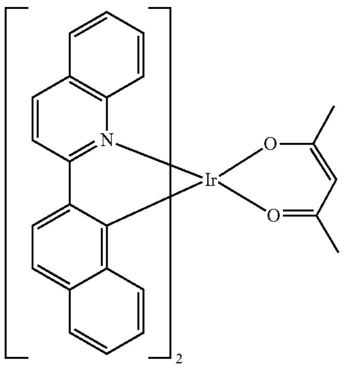 | −5.0 ± 0.3 | −2.4 ± 0.4 |
| 29 | 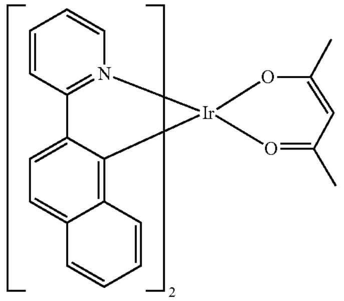 | −5.0 ± 0.3 | −2.3 ± 0.3 |

TABLE 9-continued
Example emitter molecular base structures and estimated energy levels.
| Number | Emitter base structure | HOMO range (eV) | LUMO range (eV) |
|---|---|---|---|
| 30 | 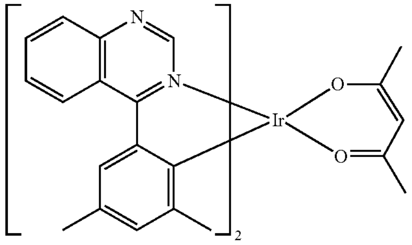 | −5.3 ± 0.3 | −3.0 ± 0.3 |
| 31 | 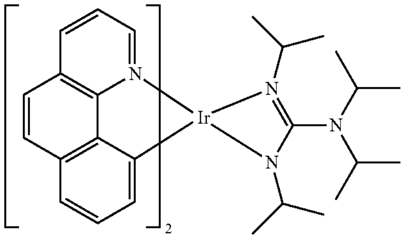 | −4.8 ± 0.3 | −2.3 ± 0.3 |
| 32 | 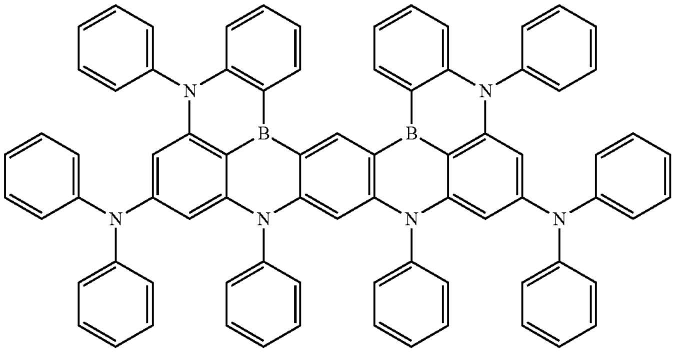 [SMILES: c1ccc(N(c2ccccc2)c2cc3c4c(c2)N(c2ccccc2)c2cc5c(cc2B4c2ccccc2N3c2ccccc2)B2c3ccccc3N(c3ccccc3)c3cc(N(c4ccccc4)c4ccccc4)cc(c32)N5c2ccccc2)cc1] | −5.4 ± 0.3 | −2.4 ± 0.4 |
| 33 | 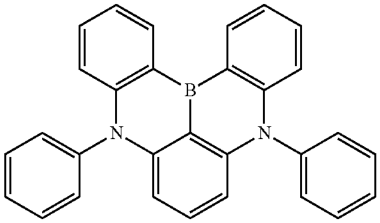 [SMILES: c1ccc(N2c3ccccc3B3c4ccccc4N(c4ccccc4)c4cccc2c43)cc1] | −5.3 ± 0.3 | −2.2 ± 0.3 |
| 34 | 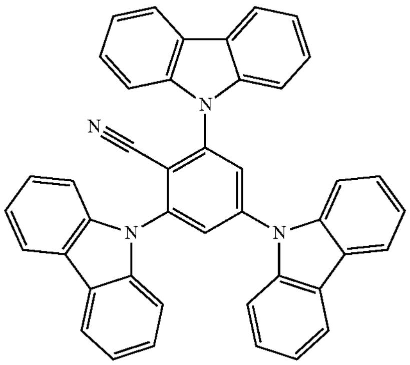 [SMILES: N#Cc1c(-n2c3ccccc3c3ccccc32)cc(-n2c3ccccc3c3ccccc32)cc1-n1c2ccccc2c2ccccc21] | −5.8 ± 0.3 | −2.6 ± 0.3 |

TABLE 9-continued

| Example emitter molecular base structures and estimated energy levels. | | | |
|---|---|---|---|
| Number | Emitter base structure | HOMO range (eV) | LUMO range (eV) |
| 35 | 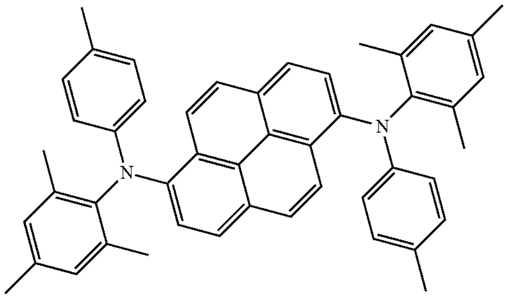 | −5.2 ± 0.3 | −2.4 ± 0.3 |

Experimental

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

The devices were fabricated in high vacuum ($<10^{-6}$ Torr) by thermal evaporation. The anode electrode was 750 Å of indium tin oxide (ITO).

The device examples containing Compound 8 had organic layers consisting of, sequentially, from the ITO surface, 100 Å thick Compound 1 (HIL), 250 Å layer of Compound 2 (HTL), 50 Å of Compound [3, 4, 5] (EBL), 50 Å of [Compound 4; Compound 5; Compound 6; Compound 7; Compound 5 doped with 40% Compound 6; Compound 5 doped with 40% Compound 7; Compound 4 doped with 40% Compound 7; Compound 4 doped with 40% Compound 6; Compound 5 doped with 30% Compound 4 and 10% Compound 3] and doped with 12% of Compound 8 (EML), 50 Å of Compound [6, 7] (BL), 150 Å of Compound 9 doped with 35% of Compound 10 (ETL), 10 Å of Compound 10 (EIL), 10 Å of Ca followed by 340 Å of Ag (Cath), 400 Å of Compound 2 (gap layer), and topped with spin cast 75 nm Ag nanocubes in 5 mg/ml concentration solution.

The device examples containing Compound 11 had organic layers consisting of, sequentially, from the ITO surface, 100 Å thick Compound 1 (HIL), 250 Å layer of Compound 2 (HTL), 50 Å of Compound [3, 4, 5] (EBL), 50 Å of [Compound 4; Compound 5; Compound 7; Compound 5 doped with 40% Compound 7; Compound 4 doped with 40% Compound 7; Compound 4 doped with 40% Compound 6; Compound 5 doped with 30% Compound 7 and 10% Compound 3] and doped with 12% of Compound 11 (EML), 50 Å of Compound [6, 7] (BL), 150 Å of Compound 9 doped with 35% of Compound 10 (ETL), 10 Å of Compound 10 (EIL), 10 Å of Ca followed by 340 Å of Ag (Cath), 400 Å of Compound 2 (gap layer), and topped with spin cast 75 nm Ag nanocubes in 5 mg/ml concentration solution.

All devices were encapsulated with a glass lid sealed with an epoxy resin in a nitrogen glove box (<1 ppm of $H_2O$ and $O_2$,) immediately after fabrication with a moisture getter incorporated inside the package. Doping percentages are in volume percent.

To obtain energy levels in Table 8, solution cyclic voltammetry and differential pulsed voltammetry were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroconium redox couple (Fc+/Fc) by measuring the peak potential differences from differential pulsed voltammetry. The EHOMO=−[(Eox1 vs Fc+/Fc)+4.8], and the ELUMO=−[(Ered1 vs Fc+/Fc)+4.8], wherein Eox1 is the first oxidation potential, and the Ered1 is the first reduction potential.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic emissive device comprising:
- a substrate;
- a first electrode disposed over the substrate;
- an emissive stack disposed over the first electrode and comprising:
  - a first organic emissive layer (EML) comprising one or more host materials and an organic emissive material; and
  - a hole blocking layer (HBL), an electron blocking layer (EBL), or both;
- a second electrode disposed over the emissive stack; and
- a first enhancement layer comprising a plasmonic material that exhibits surface plasmon resonance that non-radiatively couples to an organic emissive material in the organic emissive layer and transfers excited state energy from the organic emissive material to a non-radiative mode of surface plasmon polaritons of the enhancement layer;
- wherein the emissive stack meets one or more of the following criteria:

the emissive stack comprises an EBL that has a highest occupied molecular orbit (HOMO) energy level within 0.4 eV of a HOMO energy level of the organic emissive material;

the emissive stack comprises an EBL having a triplet energy not greater than a triplet energy of at least one of the one or more host materials;

the emissive stack comprises an HBL having a lowest unoccupied molecular orbital (LUMO) energy level within 0.3 eV of at least one of the one or more host materials;

at least one of the one or more host materials forms an exciplex with the organic emissive material;

the emissive stack comprises an HTL having a HOMO energy level within not more than 0.5 eV of at least one of the one or more host materials; and $E_{ET} \leq |HOMO_{emitter} - LUMO_{EML}| + \delta$, where $E_{ET}$ is the lowest triplet energy level among all materials in the EML, $LUMO_{EML}$ is the deepest LUMO of all materials in the EML, $HOMO_{emitter}$ is the HOMO of the emissive material, and $\delta$ is at least 0.01 eV.

2. The device of claim 1, wherein the one or more host materials comprises an electron-transporting material.

3. The device of claim 1, wherein the one or more host materials comprises a hole-transporting material.

4. The device of claim 3, wherein the one or more host materials comprises an electron-transporting material.

5. The device of claim 1, wherein the emissive stack comprises an EBL that has a highest occupied molecular orbit (HOMO) energy level within 0.4 eV of a HOMO energy level of the organic emissive material.

6. The device of claim 1, wherein the emissive stack comprises an EBL having a triplet energy not greater than a triplet energy of at least one of the one or more host materials.

7. The device of claim 1, wherein the emissive stack comprises an HBL having a lowest unoccupied molecular orbital (LUMO) energy level within 0.3 eV of at least one of the one or more host materials.

8. The device of claim 1, wherein at least one of the one or more host materials forms an exciplex with the organic emissive material.

9. The device of claim 1, wherein the emissive stack comprises an HTL having a HOMO energy level within not more than 0.5 eV of at least one of the one or more host materials.

10. The device of claim 1, wherein $E_{ET} \leq |HOMO_{emitter} - LUMO_{EML}| + \delta$, where $E_{ET}$ is the lowest triplet energy level among all materials in the EML, $LUMO_{EML}$ is the deepest LUMO of all materials in the EML, and $\delta$ is at least 0.01 eV.

11. The device of claim 10, wherein $\delta$ is at least 0.11 eV.

12. The device of claim 11, wherein $\delta$ is at least 0.21 eV.

13. The device of claim 1 wherein $E_{ET} \leq |HOMO_{EML} - LUMO_{EML}| + \delta$, where $E_{ET}$ is the lowest triplet energy level among all materials in the EML, $LUMO_{EML}$ is the deepest LUMO of all materials in the EML, $HOMO_{EML}$ is the shallowest HOMO of all materials in the EML, and $\delta$ is at least 0.01 eV; and wherein the organic emissive material has the most shallow HOMO in the EML.

14. The device of claim 1 wherein $E_{ET} \leq |HOMO_{EML} - LUMO_{EML}| + \delta$, where $E_{ET}$ is the lowest triplet energy level among all materials in the EML, $LUMO_{EML}$ is the deepest LUMO of all materials in the EML, $HOMO_{EML}$ is the shallowest HOMO of all materials in the EML, and $\delta$ is at least 0.01 eV; and wherein one of the one or more host materials has the most shallow HOMO in the EML.

15. An organic emissive device comprising:

a substrate;

a first electrode disposed over the substrate;

an emissive stack disposed over the first electrode and comprising an emissive layer, the emissive layer comprising a first host material, a second host material, and a first emitter;

a second electrode disposed over the emissive stack; and a first enhancement layer comprising a plasmonic material that exhibits surface plasmon resonance that non-radiatively couples to an organic emissive material in the organic emissive layer and transfers excited state energy from the organic emissive material to a non-radiative mode of surface plasmon polaritons of the enhancement layer;

wherein the emissive layer has an energy level structure selected from a group consisting of:

a structure in which a LUMO of the first host material is higher than a LUMO of the first emitter, the LUMO of the first emitter is higher than a LUMO of the second host material, a HOMO of the first emitter is higher than a HOMO of the first host material, and the HOMO of the first host material is higher than the HOMO of the second host material;

a structure in which the LUMO of the first emitter is higher than the LUMO of the second host material, the LUMO of the second host material is higher than the LUMO of the first host material, the HOMO of the first emitter is higher than the HOMO of the second host material, and the HOMO of the second host material is higher than the HOMO of the first host material;

a structure in which the LUMO of the first emitter is higher than the LUMO of the first host material, the LUMO of the first host material is higher than the LUMO of the second host material, the HOMO of the first emitter is higher than the HOMO of the second host material, and the HOMO of the second host material is higher than the HOMO of the first host material; and a structure in which the LUMO of the second host material is higher than the LUMO of the first emitter, the LUMO of the first emitter is higher than the LUMO of the first host material, the HOMO of the first emitter is higher than the HOMO of the first host material, and the HOMO of the first host material is higher than the HOMO of the second hos material.

16. The device of claim 15, wherein $E_{ET} \leq |HOMO_{emitter} - LUMO_{EML}| + \delta$, where $E_{ET}$ is the lowest triplet energy level among all materials in the EML, $LUMO_{EML}$ is the deepest LUMO of all materials in the EML, and $\delta$ is at least 0.01 eV.

* * * * *